(12) United States Patent
Takeyama et al.

(10) Patent No.: US 12,107,564 B2
(45) Date of Patent: Oct. 1, 2024

(54) RESONATOR AND RESONANCE DEVICE INCLUDING THE SAME

(71) Applicant: Murata Manufacturing Co., Ltd., Nagaokakyo (JP)

(72) Inventors: Keisuke Takeyama, Nagaokakyo (JP); Toshio Nishimura, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 375 days.

(21) Appl. No.: 17/749,736

(22) Filed: May 20, 2022

(65) Prior Publication Data

US 2022/0278671 A1 Sep. 1, 2022

Related U.S. Application Data

(63) Continuation of application No. PCT/JP2020/028109, filed on Jul. 20, 2020.

(30) Foreign Application Priority Data

Jan. 6, 2020 (JP) ................................. 2020-000428

(51) Int. Cl.
*H03H 9/24* (2006.01)
*H03H 9/05* (2006.01)
*H03H 9/10* (2006.01)

(52) U.S. Cl.
CPC ........ *H03H 9/2452* (2013.01); *H03H 9/0595* (2013.01); *H03H 9/1057* (2013.01)

(58) Field of Classification Search
CPC ... H03H 9/0595; H03H 9/1057; H03H 9/2452
See application file for complete search history.

(56) References Cited

U.S. PATENT DOCUMENTS

| 10,333,486 | B2 | 6/2019 | Takeyama et al. |
| 2016/0322953 | A1* | 11/2016 | Takeyama ............ H03H 3/0077 |
| 2018/0048284 | A1* | 2/2018 | Nakamura ........... H03H 9/2452 |
| 2018/0191330 | A1* | 7/2018 | Nishimura ........... H03H 9/0595 |
| 2020/0204149 | A1* | 6/2020 | Nishimura ......... H03H 9/02448 |

FOREIGN PATENT DOCUMENTS

| JP | 6241684 B2 | 12/2017 |
| WO | 2016159016 A1 | 10/2016 |
| WO | 2016159022 A1 | 10/2016 |
| WO | 2019058632 A1 | 3/2019 |

OTHER PUBLICATIONS

International Search Report in PCT/JP2020/028109, mailed Sep. 15, 2020, 2 pages.

* cited by examiner

*Primary Examiner* — Naishadh N Desai
(74) *Attorney, Agent, or Firm* — ArentFox Schiff LLP

(57) ABSTRACT

A resonator is provided that includes a vibrator with two portions that vibrate in phases opposite to each other; a frame that is disposed to surround at least part of the vibrator; and a holding unit that supports a boundary between the two portions and connects the vibrator to the frame. Moreover, a frequency adjustment film is disposed on a surface of the vibrator in an area between a connection portion of the holding unit connected to the vibrator and an end of the vibrator that faces the connection portion in a direction along the boundary between the two portions.

20 Claims, 24 Drawing Sheets

FIG. 14
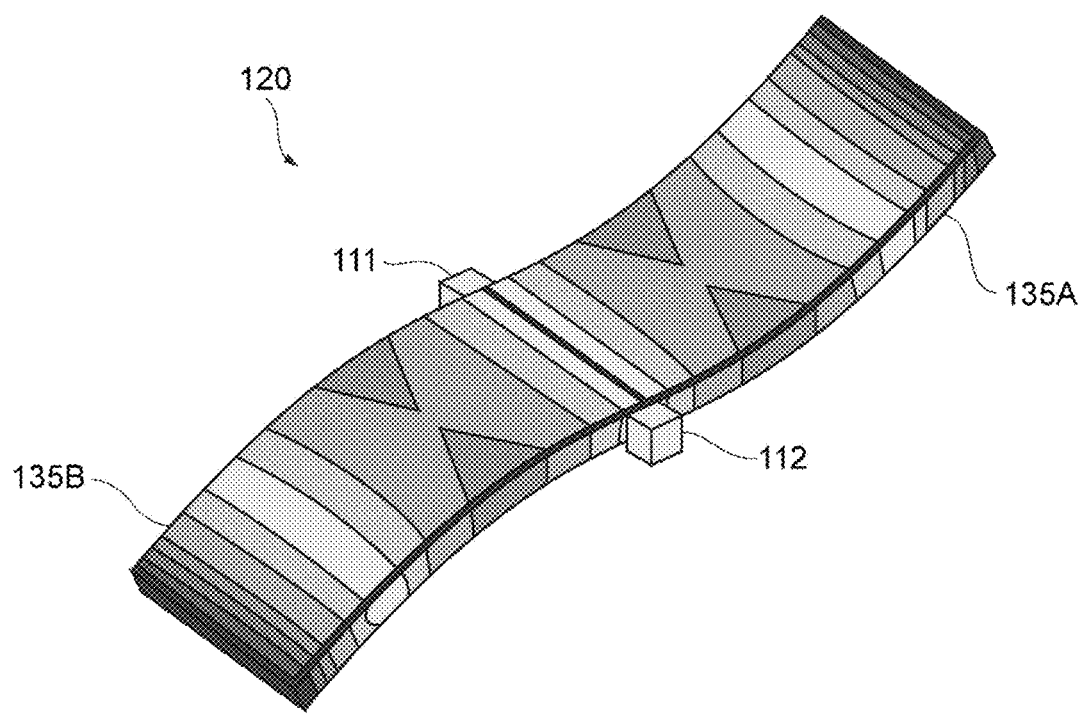
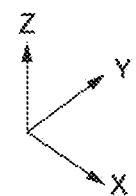

FIG. 15
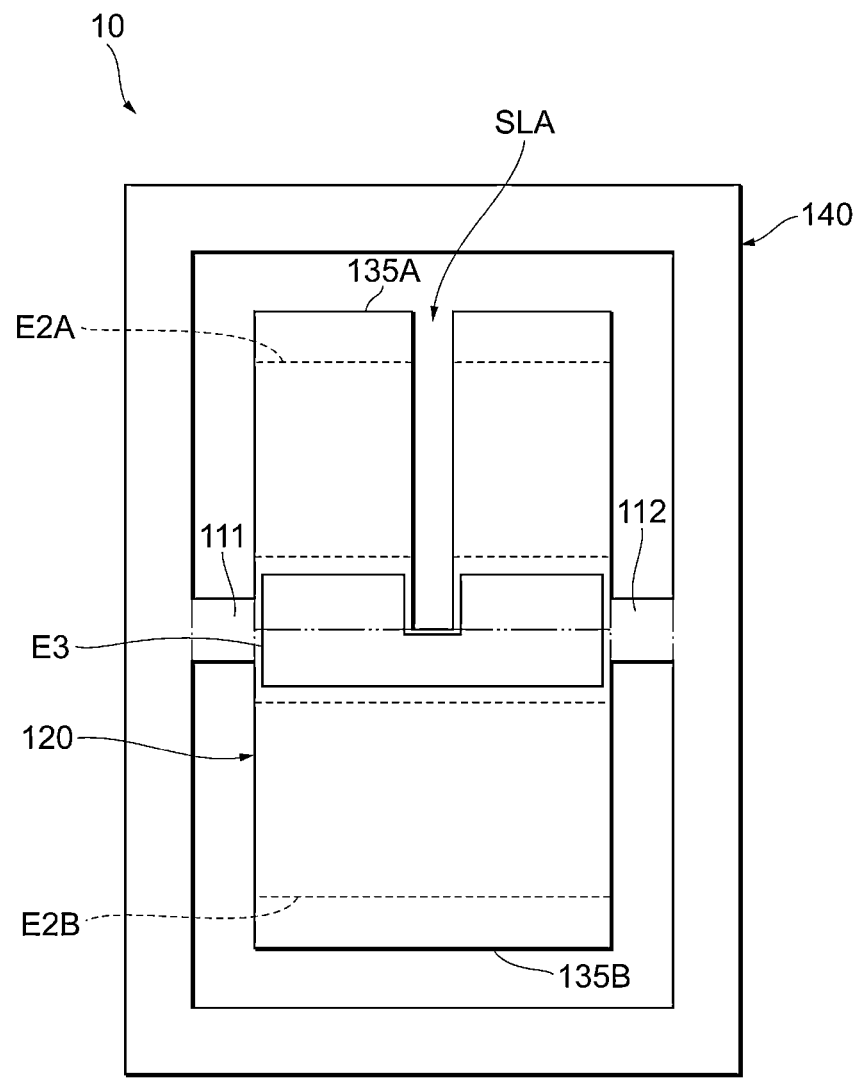
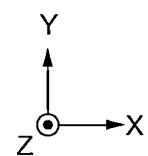

FIG. 17
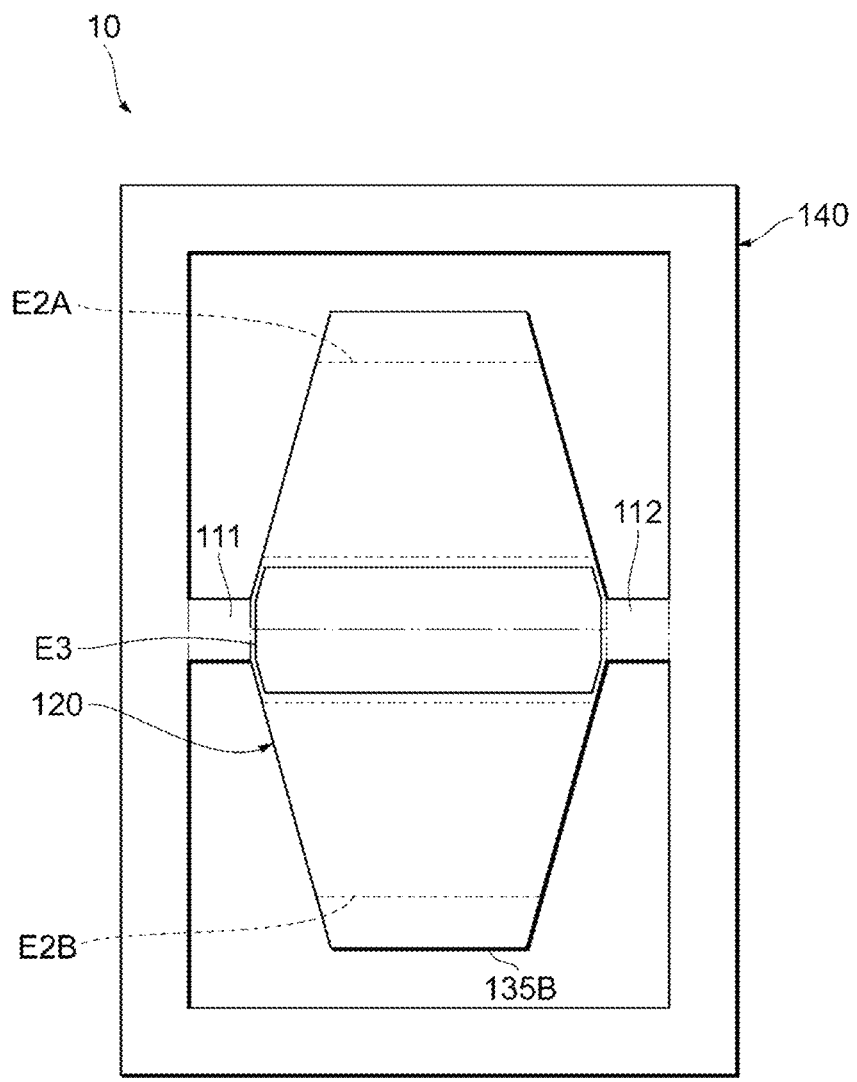
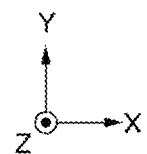

RESONATOR AND RESONANCE DEVICE INCLUDING THE SAME

CROSS REFERENCE TO RELATED APPLICATIONS

This application is a continuation of PCT Application No. PCT/JP2020/028109, filed Jul. 20, 2020, which claims priority to Japanese Patent Application No. 2020-000428, filed Jan. 6, 2020, the entire contents of each of which are hereby incorporated in their entirety.

TECHNICAL FIELD

The present invention relates to a resonator and a resonance device including the same.

BACKGROUND

Currently, resonance devices are included in various types of electronic devices such as a mobile communication terminal, a communication base station, and a household electric appliance to be used as, for example, a timing device, a sensor, or an oscillator. One resonance device is, for example, a type of microelectromechanical systems (MEMS). Such a resonance device includes, for example, a lower lid, an upper lid that defines an internal space between itself and the lower lid, and a resonator that includes a vibrator held in the internal space while being allowed to vibrate. The vibrator includes, for example, a temperature-characteristics correction layer that corrects changes of frequencies depending on temperature, or a frequency adjustment film that changes frequencies by being partially removed.

Japanese Patent No. 6241684 (hereinafter "Patent Document 1") discloses a resonator including a frequency adjustment film located in an area that has a large displacement, and a protective film located in an area that has a small displacement.

International Publication No. 2019/058632 (hereinafter "Patent Document 2") discloses a resonator including two films in an area that has a small displacement and including a frequency adjustment film in an area that has a large displacement. The two films include a first temperature-characteristics adjustment film having a positive temperature coefficient of frequency and a second temperature-characteristics adjustment film having a negative temperature coefficient of frequency.

However, when the resonator described in each of Patent Documents 1 and 2 performs a frequency adjustment process through ion milling, the frequency change amount per unit time may fall below that in a resonator not including the frequency adjustment film.

SUMMARY OF THE INVENTION

Accordingly, the exemplary embodiments of the present invention provide a resonator with enhanced productivity and a resonance device including the resonator.

In an exemplary aspect, a resonator is provided that includes a vibrator having two portions that vibrate in phases opposite to each other, a holding portion or frame that surrounds at least part of the vibrator, and a holding unit that supports a boundary between the two portions and connects the vibrator and the holding portion to each other. Moreover, a frequency adjustment film is disposed on a surface of the vibrator in an area between a connection portion of the holding unit connected to the vibrator and an end portion of the vibrator facing the connection portion in a direction along the boundary between the two portions.

A resonator according to another exemplary aspect includes a vibrator with two portions that vibrate in phases opposite to each other, and a frequency adjustment film disposed on a surface of the vibrator in an area closer to a boundary between the two portions of the vibrator than center portions of the two portions.

A resonator according to another exemplary aspect includes a vibrator with two portions that vibrate in phases opposite to each other, a holding portion or frame that surrounds the vibrator at least partially, and a holding unit that connects the vibrator and the holding portion to each other. The vibrator includes a piezoelectric film, a lower electrode disposed on a first side of the piezoelectric film, two upper electrodes that are disposed on a second side of the piezoelectric film at the two portions of the vibrator and face the lower electrode with the piezoelectric film interposed therebetween, a protective film that covers the two upper electrodes, and a frequency adjustment film that faces the lower electrode with the piezoelectric film and the protective film interposed therebetween. When the surface of the vibrator is viewed in a plan, the frequency adjustment film is located in an area closer to opposing end portions of the two upper electrodes than center portions of the two upper electrodes.

According to the exemplary embodiments of the present invention, a resonator is provided with enhanced productivity and a resonance device including the resonator is also provided.

BRIEF DESCRIPTION OF DRAWINGS

FIG. 14 is a schematic perspective view of a vibration form of a vibrator according to the fifth exemplary embodiment.

FIG. 15 is a schematic plan view of a structure of a resonator according to a modification example of the fifth exemplary embodiment.

FIG. 17 is a schematic plan view of a structure of a resonator according to a modification example of the fifth exemplary embodiment.

DETAILED DESCRIPTION OF EMBODIMENTS

Exemplary embodiments of the present invention will be described below with reference to the drawings. The drawings of the embodiments are mere examples, and the dimensions or shapes of components are schematic. The technical scope of the present invention should not be construed as being limited to these embodiments.

Each of the drawings may include an orthogonal coordinate system including an X axis, a Y axis, and a Z axis for convenience to clarify the relationship between the drawings and to facilitate understanding of the positional relationship between the components. The directions parallel to the X axis, the Y axis, and the Z axis are respectively referred to as an X-axis direction, a Y-axis direction, and a Z-axis direction. The plane defined by the X axis and the Y axis is referred to as an XY plane. This applies to a YZ plane and a ZX plane. For convenience, the direction in which the arrow in the Z-axis direction points (Z-axis positive direction) may be referred to as upward, and the direction opposite to the direction in which the arrow in the Z-axis direction points (Z-axis negative direction) may be referred to as downward. However, this does not limit the orientation of a resonance device 1 as should be appreciated to one skilled in the art.

First Exemplary Embodiment

Figure 1:
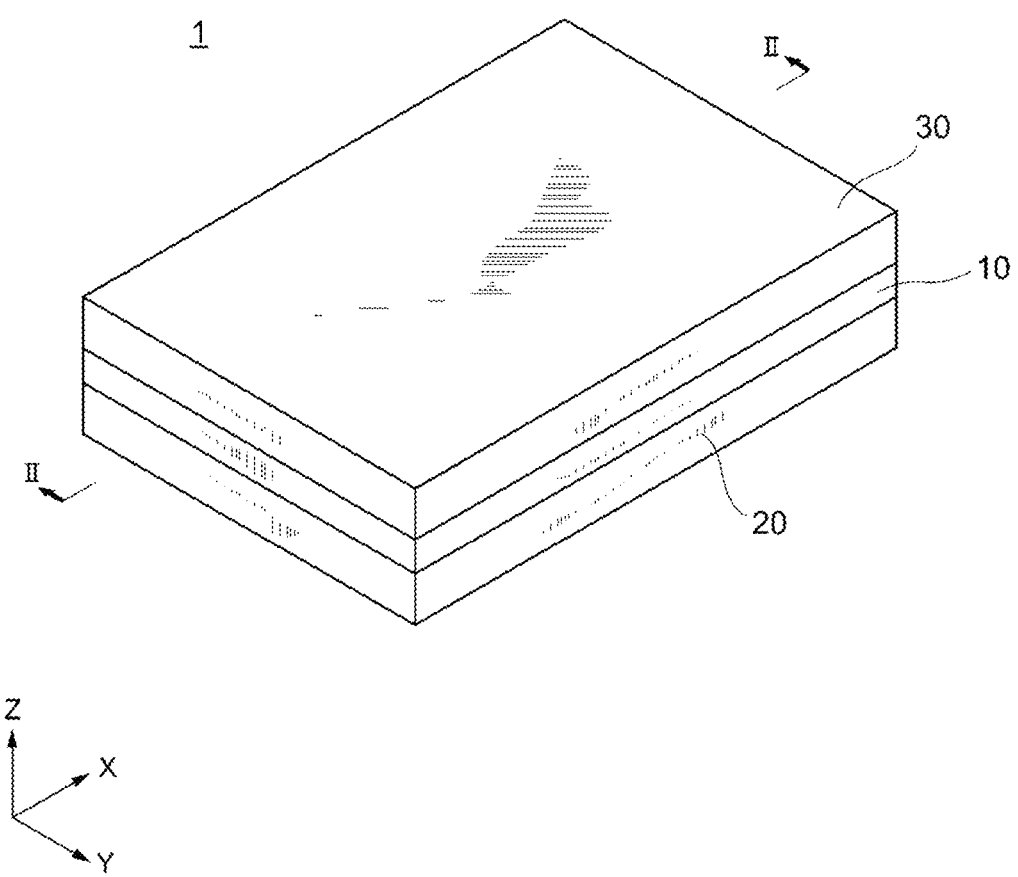
FIG. 1 is a schematic perspective view of the appearance of a resonance device according to a first exemplary embodiment.
Figure 2:
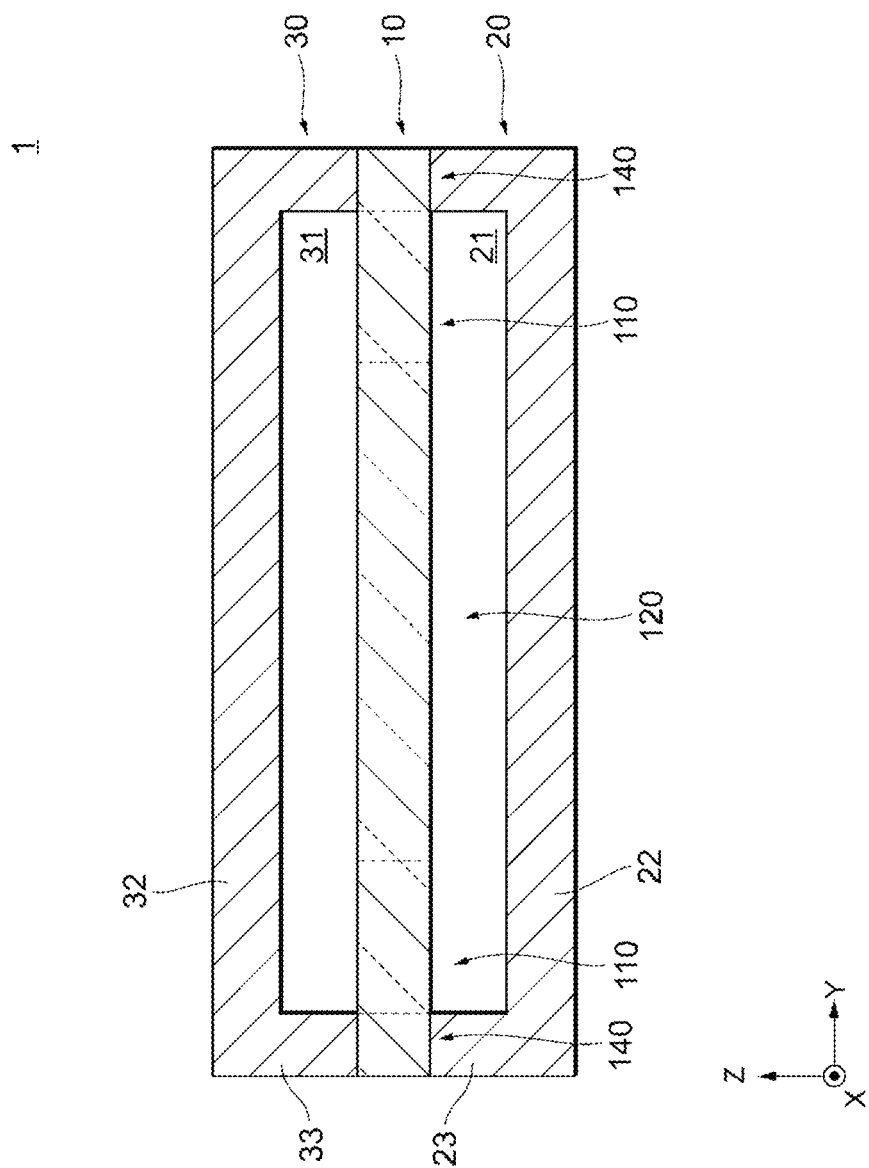
FIG. 2 is a cross-sectional view of the resonance device shown in FIG. 1 taken along line II-II.

First, with reference to FIG. 1 and FIG. 2, a schematic structure of a resonance device 1 according to a first exemplary embodiment will be described. FIG. 1 is a schematic perspective view of the appearance of a resonance device according to the first embodiment. FIG. 2 is a cross-sectional view of the resonance device shown in FIG. 1 taken along line II-II.

In general, the resonance device 1 includes a resonator 10, and a lower lid 20 and an upper lid 30 disposed to face each other with the resonator 10 interposed therebetween. The lower lid 20, the resonator 10, and the upper lid 30 are laminated in this order in the Z-axis direction. The lower lid 20 and the upper lid 30 form a lid or body that accommodates the resonator 10, and are bonded to each other with the resonator 10 interposed therebetween. The internal space of the lid defined by the lower lid 20 and the upper lid 30 is hermetically sealed under vacuum and can be filled with gas such as an inert gas, for example.

In an exemplary aspect, the resonator 10 is a MEMS vibration element manufactured with the MEMS technology. The frequency of the resonator 10 ranges from, for example, 1 kHz to 10 MHz. The resonator 10 includes a vibrator 120, a holding portion 140 (also referred to as a frame), and a pair of holding units 110. The vibrator 120 is held in the internal space of the lid while being allowed to vibrate. The holding portion 140 is joined to the lower lid 20 and the upper lid 30 to hold the resonator 10 in the lid. The holding portion 140 has, for example, a frame shape to surround the vibrator 120. The pair of holding units 110 connect the vibrator 120 to the holding portion 140. In an alternative aspect, one holding unit rather than the pair of holding units 110 can be provided.

The lower lid 20 includes a rectangular planar bottom plate 22 extending along the XY plane, and side walls 23 extending toward the upper lid 30 from the periphery of the bottom plate 22. The side walls 23 are joined to the holding portion (or frame) 140 of the resonator 10. On a surface of the lower lid 20 facing the vibrator 120 of the resonator 10, a cavity 21 is formed by being surrounded with the bottom plate 22 and the side walls 23. The cavity 21 is rectangular parallelepiped and opens upward and is part of an internal space of the lid.

As shown in FIG. 2, the upper lid 30 includes a rectangular planar bottom plate 32 extending along the XY plane, and side walls 33 extending toward the lower lid 20 from the periphery of the bottom plate 32. The side walls 33 are joined to the holding portion 140 of the resonator 10. On a surface of the upper lid 30 facing the vibrator 120 of the resonator 10, a cavity 31 is formed by being surrounded with the bottom plate 32 and the side walls 33. In particular, the cavity 31 is rectangular parallelepiped and opens downward and is part of an internal space of the lid.

It is noted that the bottom plate 22 of the lower lid 20 and the bottom plate 32 of the upper lid 30 can have a shape other than a rectangular shape in a plan view of the XY plane, such as a circular, elliptic, or polygonal shape or a combination of two or more of these in alternative aspects. The cavity 21 of the lower lid 20 and the cavity 31 of the upper lid 30 may have a shape other than a rectangular parallelepiped shape, such as a circular, elliptic, or polygonal cylinder, a cone, a pyramid, or a combination of two or more of these.

In addition, a getter can be disposed on at least one of inner surfaces of the cavity 21 of the lower lid 20 and the cavity 31 of the upper lid 30. In this aspect, the getter absorbs a gas remaining in the internal space of the lid to improve a vacuum. The getter is a metal film formed from, for example, nickel (Ni), molybdenum (Mo), titanium (Ti), tantalum (Ta), tungsten (W), or barium (Ba).

In an exemplary aspect, the resonator 10, the lower lid 20, and the upper lid 30 are each formed from a silicon (Si)

substrate. The resonator 10, the lower lid 20, and the upper lid 30 can each be formed from a silicon on insulator (SOI) substrate formed by laminating a silicon layer and a silicon oxide film. Instead of a silicon substrate, the resonator 10, the lower lid 20, and the upper lid 30 may each be formed any substrate processible with a fine-processing technology such as a compound semiconductor substrate, a glass substrate, a ceramic substrate, or a resin substrate.

Figure 3:
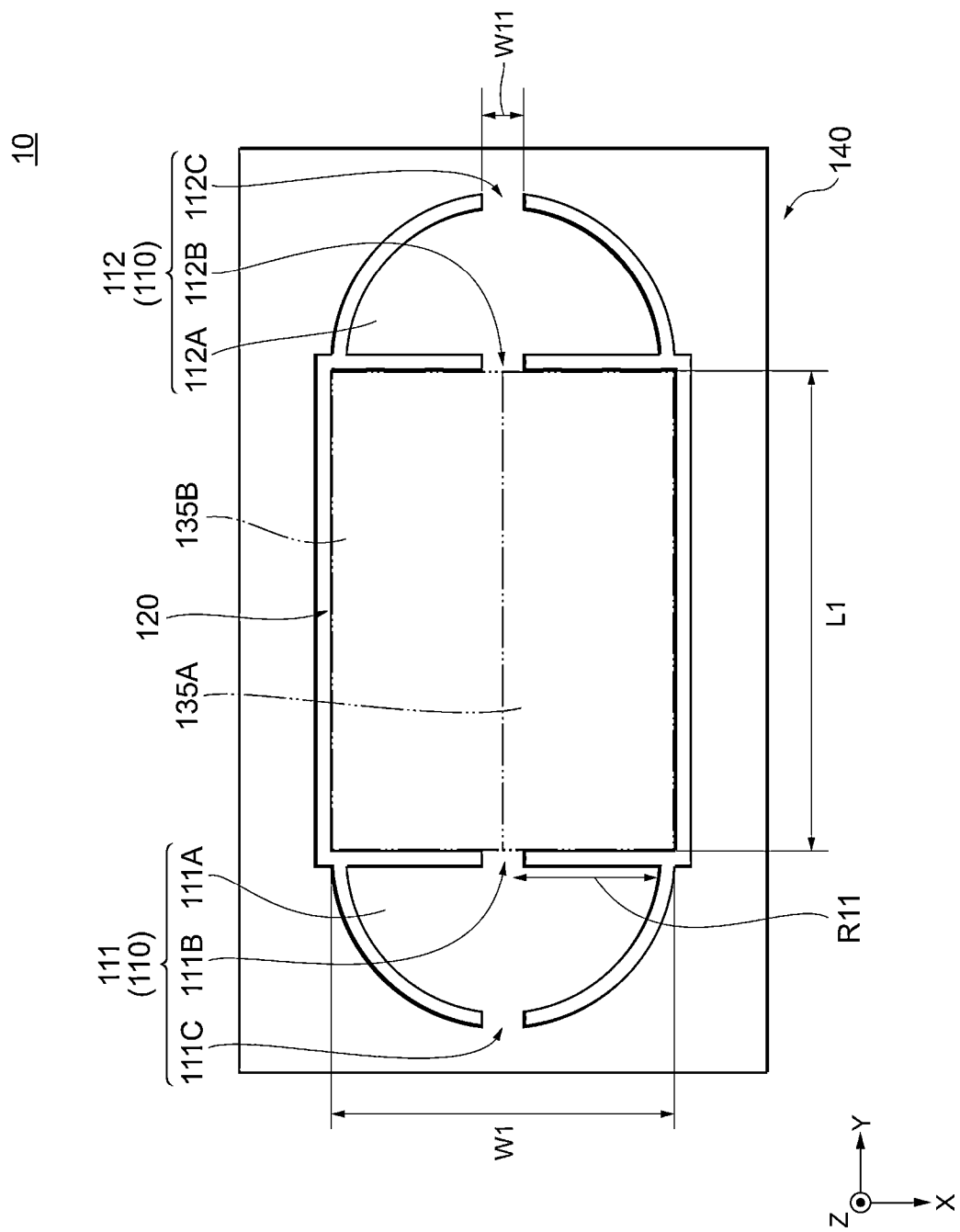
FIG. 3 is a schematic plan view of a structure of the resonator according to the first exemplary embodiment.

With reference to FIG. 3 now, the structure of the resonator 10 (i.e., the vibrator 120, the holding portion 140, and the pair of holding units 110) will be more specifically described. FIG. 3 is a schematic plan view of a structure of the resonator according to the first exemplary embodiment.

When the plane facing the upper lid 30 is viewed in a plan (hereinafter simply referred to as "in a plan view"), the vibrator 120 has a rectangular profile extending in the XY plane. The vibrator 120 has long sides extending in the Y-axis direction and short sides extending in the X-axis direction. Moreover, the vibrator 120 is disposed on the inner side of the holding portion 140, and a space with a predetermined distance is formed between the vibrator 120 and the holding portion 140.

When viewed in a plan, the vibrator 120 has a length L1 in the Y-axis direction (hereinafter simply referred to as "a length L1"), and a width W1 in the X-axis direction (hereinafter simply referred to as "a width W1"). For purposes of this disclosure, the length L1 corresponds to a dimension of the long sides of the vibrator 120, and the width W1 corresponds to a dimension of the short sides of the vibrator 120. For example, the length L1 is approximately 240 µm, and the width W1 is approximately 190 µm.

Moreover, the vibrator 120 includes two portions 135A and 135B adjacent to each other. The first portion 135A and the second portion 135B are arranged side by side in the X-axis direction as shown in FIG. 3. The second portion 135B is located on the side of the first portion 135A in the X-axis negative direction. In a plan view, the boundary between the first portion 135A and the second portion 135B corresponds to a bisector of the vibrator 120. The bisector extends in the Y-axis direction at the center portion of the vibrator 120 in the X-axis direction. In a plan view, the length of the first portion 135A and the second portion 135B in the Y-axis direction is substantially equal to the length L1 of the vibrator 120. Similarly, he width of the first portion 135A and the second portion 135B in the X-axis direction is substantially half the width W1 of the vibrator 120. As such, the first portion 135A and the second portion 135B can have a substantially same shape (in a plan view) according to an exemplary aspect.

In operation, the first portion 135A and the second portion 135B are configured to vibrate in phases opposite to each other in an out-of-plane bending vibration mode with respect to the XY plane as main vibrations. Vibrations of the first portion 135A and the second portion 135B will be described in detail later. It is noted that the vibration mode of the first portion 135A and the second portion 135B is not limited to the above vibration mode.

The holding portion 140 is a portion for holding the vibrator 120 in the internal space defined by the lower lid 20 and the upper lid 30, and has, for example, a frame shape to surround the vibrator 120. In the example illustrated in FIG. 3, a space with a predetermined distance is formed not only between the holding portion 140 and the vibrator 120, but also between the holding portion 140 and the pair of holding units 110. In other words, when viewed in a plan, the holding portion 140 is formed along the profiles of the vibrator 120 and the pair of holding units 110. The distance between the vibrator 120, the holding portion 140, and the pair of holding units 110 is approximately 10 µm, for example.

Instead of a rectangular frame shape, the holding portion 140 may have any shape with which the holding portion 140 can at least partially surround the periphery of the vibrator 120. For example, the holding portion 140 can be disposed around the vibrator 120 while holding the vibrator 120 and being joined to the lower lid 20 and the upper lid 30.

In the exemplary aspect, the pair of holding units 110 hold the boundary between the two portions 135A and 135B from both sides, and connect the vibrator 120 and the holding portion 140 to each other. The pair of holding units 110 includes a first holding unit 111 and a second holding unit 112. The first holding unit 111 is connected to an end portion of the vibrator 120 in the Y-axis negative direction (e.g., a left end in FIG. 3). The second holding unit 112 is connected to an end portion of the vibrator 120 in the Y-axis positive direction (e.g., a right end in FIG. 3).

The first holding unit 111 includes a node generator 111A and arms 111B and 111C. The arm 111B is disposed between the node generator 111A and the vibrator 120, and the arm 111C is disposed on the side of the node generator 111A further from the vibrator 120. Similarly, the second holding unit 112 includes a node generator 112A and arms 112B and 112C. The arm 112B is disposed between the node generator 112A and the vibrator 120, and the arm 112C is disposed on the side of the node generator 112A further from the vibrator 120.

When viewed in a plan view, the node generators 111A and 112A have a semi-circular shape with a radius R11. Moreover, the node generators 111A and 112A each have a straight end on the side next to the vibrator 120, and an arc-shaped end on the side further from the vibrator 120. For example, the radius R11 is approximately 80 µm in an exemplary aspect.

The arm 111B connects the node generator 111A and the vibrator 120 to each other, and the arm 112B connects the node generator 112A and the vibrator 120 to each other. The arm 111C connects the node generator 111A to the holding portion 140, and the arm 112C similarly connects the node generator 112A to the holding portion 140. The arm 111B corresponds to a connection portion of the first holding unit 111 connected to the vibrator 120, and the arm 112B corresponds to a connection portion of the second holding unit 112 connected to the vibrator 120. The arms 111B and 111C and the arms 112B and 112C are located on the extension of the boundary between the two portions 135A and 135B of the vibrator 120. In other words, the arms 111B and 112B are connected to center portions of the node generators 111A and 112A at the end portions next to the vibrator 120 and connected to center portions of the vibrator 120 at the end portions including the short sides. The arms 111C and 112C are connected to center portions of the node generators 111A and 112A at the end portions further from the vibrator 120. The arms 111B and 111C and the arms 112B and 112C have a width W11 in the X-axis direction (hereinafter simply referred to as "a width W11"). The width W11 corresponds to a width in the X-axis direction of the connection portions of the pair of holding units 110 connected to the vibrator 120. For example, the width W11 is 10 µm.

In general, it is noted that the shape of the node generators 111A and 112A is not limited to the above. The node generators 111A and 112A may have any shape, in a plan view, in which the width in the X-axis direction is at largest at a position closer to the vibrator 120 with respect to a center in the Y-axis direction and decreases further as it is spaced apart from the position with the largest width. For example, the node generators 111A and 112A may have an arc-shaped end portion on the side next to the vibrator 120, and a straight end portion on the side away from the vibrator 120. The first holding unit 111 or the second holding unit 112 may be omitted as long as the boundary between the two portions 135A and 135B of the vibrator 120 is supportable. For example, in one exemplary aspect, the second holding unit 112 can be omitted, and the vibrator 120 may be supported by only the first holding unit 111.

Figure 4:
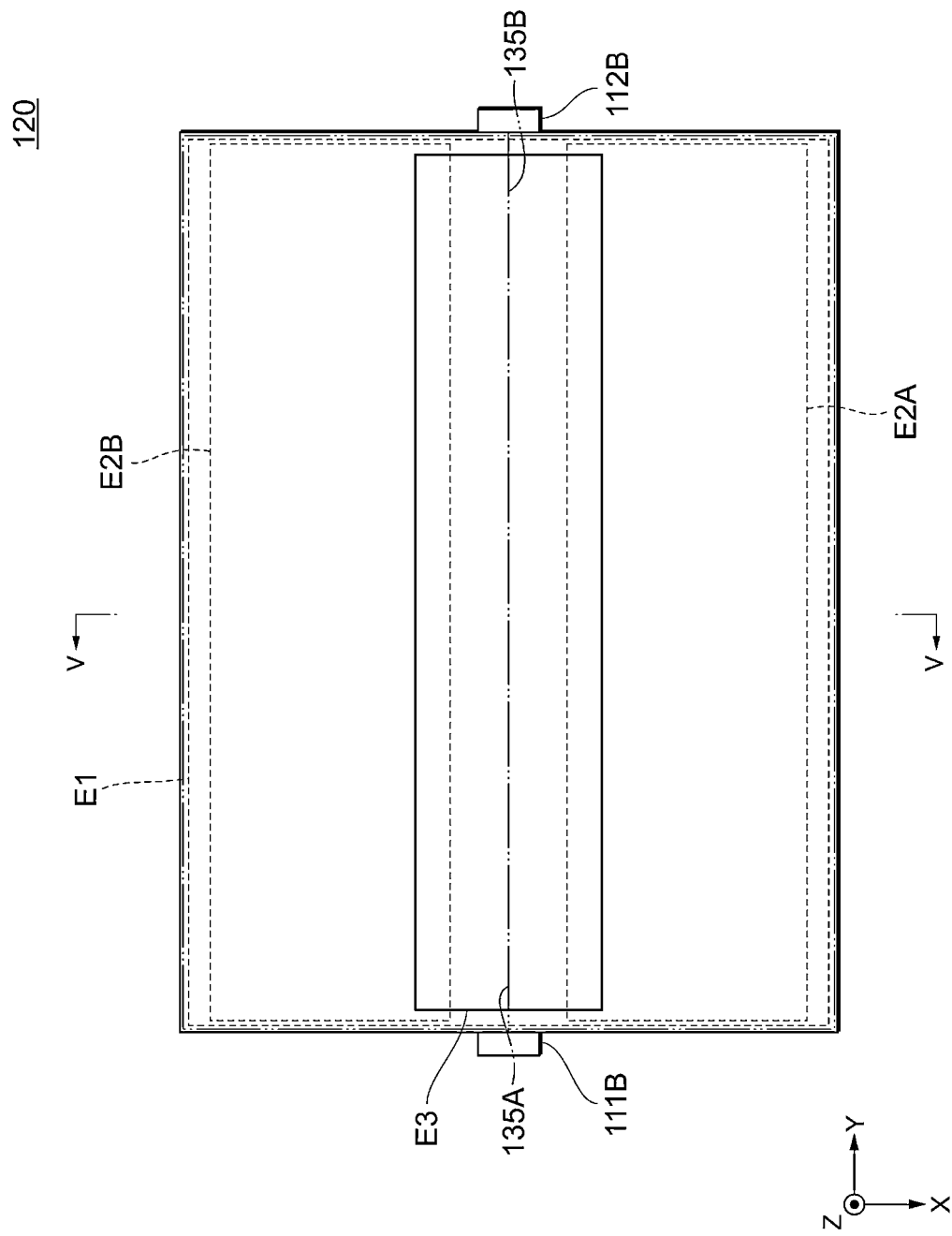
FIG. 4 is a schematic plan view of the structure of a vibrator according to the first exemplary embodiment.
Figure 5:
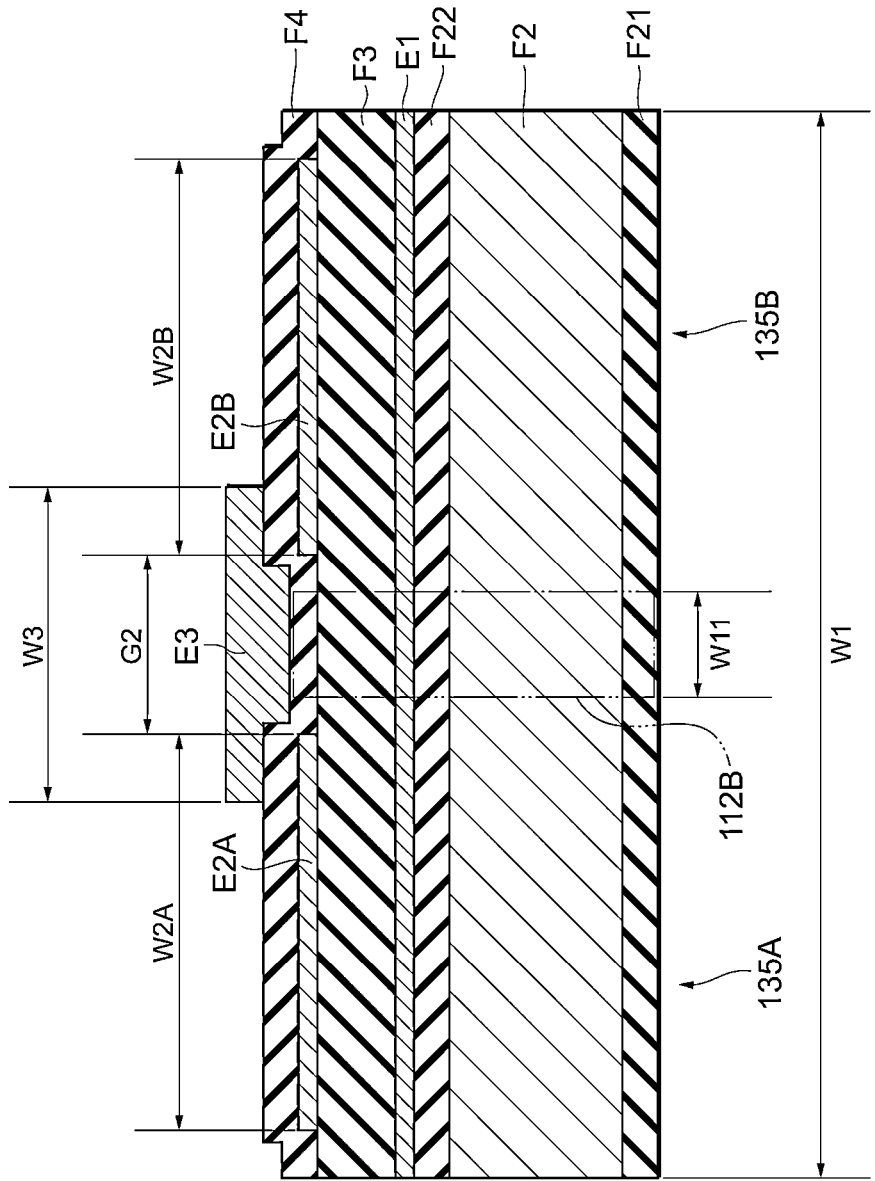
FIG. 5 is a cross-sectional view of the vibrator shown in FIG. 4 taken along line V-V.

Subsequently, with reference to FIG. 4 and FIG. 5, the structure of the vibrator 120 will be described in further details. FIG. 4 is a schematic plan view of a structure of the vibrator according to the first embodiment. FIG. 5 is a cross-sectional view of the vibrator shown in FIG. 4 taken along line V-V.

In an exemplary aspect, the vibrator 120 is integrally formed with the holding portion 140 and the pair of holding units 110 in the same process. In the resonator 10, a silicon oxide film F21 is disposed on a surface of a silicon substrate F2 facing the lower lid 20 to cover the silicon substrate F2. The silicon substrate F2 serves as an example of a substrate. A silicon oxide film F22 is disposed on a surface of the silicon substrate F2 facing the upper lid 30 to cover the silicon substrate F2. A metal film E1 is laminated on the silicon oxide film F22. A piezoelectric film F3 is laminated on the metal film E1 to cover the metal film E1, and metal films E2A and E2B are laminated on the piezoelectric film F3. A protective film F4 is laminated on the metal films E2A and E2B to cover a metal film E2A and E2B. Moreover, a metal film E3 is laminated on the protective film F4. The outer shapes of the vibrator 120, the holding portion 140, and the pair of holding units 110 are formed by performing a removal process on a multilayer body through dry etching using argon (Ar) ion beams and patterning the multilayer body. The multilayer body includes the silicon oxide film F21, the silicon substrate F2, the silicon oxide film F22, the metal film E1, the piezoelectric film F3, the metal films E2A and E2B, the protective film F4, and the metal film E3.

The silicon substrate F2 is formed from, for example, a degenerate n-type silicon (Si) semiconductor with a thickness of approximately 10 µm, and may contain, for example, phosphor (P), arsenic (As), or antimony (Sb) as an n-type dopant. Degenerate silicon (Si) used as the silicon substrate F2 has a resistance of, for example, smaller than 16 mΩ·cm, and more preferably, smaller than or equal to 1.2 mΩ·cm.

The silicon oxide films F21 and F22 are insulator films formed from a silicon dioxide ($SiO_2$) as a main component. The silicon oxide films F21 and F22 function as temperature-characteristics correction layers that reduce the temperature coefficients of frequency (TCF) of the resonator 10. Moreover, the silicon oxide films F21 and F22 reduce, particularly, the amount of change in frequency with the change in temperature around a normal temperature. Thus, the vibrator 120 including the silicon oxide films F21 and F22 improves the temperature characteristics of the resonator 10. In addition, a silicon dioxide serving as a main component of the silicon oxide film F22 has a low thermal conductivity. Thus, the silicon oxide film F22 is also configured to serve as a heat-conduction reducing layer that elongates time for thermal conduction to reduce thermoelastic damping (TED). Thus, the vibrator 120 including the silicon oxide film F22 improves the Q-value of the resonance frequency of the resonator 10 (hereinafter simply referred to as "a Q-value").

In the exemplary aspect, the silicon oxide films F21 and F22 have a thickness of, for example, approximately 0.5 µm.

The silicon oxide films F21 and F22 can be formed by heat oxidation of the silicon substrate F2, and thus the manufacturing costs can be reduced. Instead of the silicon oxide films F21 and F22, an insulator film may be formed from a material other than a silicon dioxide as a main component. The material of the temperature-characteristics correction layer may be selected to have a preferable temperature coefficient of frequency. Moreover, the heat-conduction reducing layer may be formed from any material that has a low thermal conductivity. The temperature-characteristics correction layer and the heat-conduction reducing layer may be deposited by any method preferably selected from deposition methods including chemical vapor deposition (CVD) and physical vapor deposition (PVD).

The metal films E1, E2A, and E2B function as excitation electrodes that excite the piezoelectric film F3 in the vibrator 120, and function as extended electrodes that electrically connect the excitation electrodes to an external power supply or the earth in the holding portion 140 and the pair of holding units 110. In the vibrator 120, the metal film E1 disposed on one side of the piezoelectric film F3 corresponds to a lower electrode, and the metal films E2A and E2B disposed on the other side of the piezoelectric film F3 correspond to two upper electrodes. As further shown, the metal film E1 extends throughout the vibrator 120, that is, extends continuously throughout the two portions 135A and 135B. The metal film E2A is disposed in the first portion 135A, and the metal film E2B is disposed in the second portion 135B.

The metal films E1, E2A, and E2B have a thickness of, for example, approximately greater than or equal to 0.1 µm and smaller than or equal to 0.2 µm. After being deposited, the metal films E1, E2A, and E2B are each patterned into an excitation electrode or an extended electrode through removal processing such as etching. The metal films E1, E2A, and E2B are formed from, for example, a metal material with a body-centered cubic crystal structure. More specifically, the metal films E1, E2A, and E2B are formed from, for example, molybdenum (Mo) or tungsten (W). When the silicon substrate F2 has high conductivity and does not include the silicon oxide film F22, the metal film E1 may be omitted and the silicon substrate F2 may function as a lower electrode.

The piezoelectric film F3 is a thin film formed by a type of a piezoelectric body that converts the electric energy and the mechanical energy to each other. The piezoelectric film F3 is formed from a material having a wurtzite hexagonal crystal structure, and may contain, as a main component, a nitride or an oxide such as an aluminum nitride (AlN), a scandium aluminum nitride (ScAlN), a zinc oxide (ZnO), a gallium nitride (GaN), or an indium nitride (InN). A scandium aluminum nitride is formed by replacing part of aluminum in an aluminum nitride with scandium. Instead of scandium, part of aluminum in an aluminum nitride may be replaced with two chemical elements such as magnesium (Mg) and niobium (Nb), or magnesium (Mg) and zirconium (Zr). The piezoelectric film F3 has a thickness of, for example, approximately 0.8 µm, but may have a thickness of approximately 0.2 µm to 2 µm.

According to the exemplary aspect, the protective film F4 protects, for example, the metal film E2 against oxidation. The protective film F4 is disposed over the entirety of the vibrator 120 to cover the metal films E2A and E2B. The protective film F4 is formed from, for example, an oxide, a nitride, or an oxynitride containing, for example, aluminum (Al), silicon (Si), or tantalum (Ta). The protective film F4 may be formed from the material the same as that of the piezoelectric film F3. The protective film F4 has a thickness of, for example, approximately 0.2 μm. The surface of the protective film F4 has projections and depressions reflecting the thickness of the metal films E2A and E2B. The protective film F4 may have a large thickness to reduce the size of the projections and depressions on the surface.

The metal film E3 is disposed on the surface of the vibrator 120 in an area between the connection portions 111B and 112B of the pair of holding units 110 connected to the vibrator 120. When viewed in a plan view, the metal film E3 is disposed in an area closer to the boundary between the two portions 135A and 135B than the center portions of the two portions 135A and 135B of the vibrator 120. The metal film E3 is disposed in an area closer to the opposing end portions of the two metal films E2A and E2B than the center portions of the two metal films E2A and E2B. Between the two metal films E2A and E2B, the metal film E3 faces the metal film E1 with the piezoelectric film F3 and the protective film F4 interposed therebetween. In a plan view, the metal film E3 overlaps the boundary between the two portions 135A and 135B and the opposing end portions of the two metal films E2A and E2B.

Furthermore, the metal film E3 corresponds to a frequency adjustment film. In a frequency adjustment process, which is one of the manufacturing processes, the frequency of the resonator 10 is adjusted through trimming to remove part of the metal film E3. An example of trimming is dry etching including radiation of argon (Ar) ion beams. To efficiently adjust the frequency of the resonator 10, the metal film E3 is preferably formed from a material that reduces its mass through etching at a faster rate than the rate at which the protective film F4 does. The rate at which the mass is reduced is expressed by a product of the etching rate and the density. The etching rate indicates the thickness removed per unit time. As long as the rates at which the protective film F4 and the metal film E3 reduce their mass have the above relationship, the etching rates between the protective film F4 and the metal film E3 may have any relationship. The metal film E3 is formed from, for example, a metal material such as molybdenum (Mo), tungsten (W), gold (Au), platinum (Pt), nickel (Ni), or titanium (Ti). In trimming, part of the protective film F4 may be removed in an exemplary aspect.

It is noted that the position of the metal film E3 is not limited to the area between the connection portions 111B and 112B on the surface of the vibrator 120. The metal film E3 can be located in an area between the connection portion of the holding unit 110 connected to the vibrator 120 and the end portion of the vibrator 120 facing the connection portion in a direction along the boundary between the two portions 135A and 135B of the vibrator 120. In other words, the metal film E3 can be located in an area along part of the boundary between the adjacent portions of the vibrator 120 that is supported by at least one holding unit. For example, when the vibrator 120 includes three or more portions that vibrate in phases opposite to each other and the pair of holding units 110 support different boundaries, the metal film E3 may be located in an area along the boundary supported by at least one holding unit of the pair of holding units 110, and may also be located in an area along the boundary supported by the other holding unit. When the vibrator 120 is supported by a single holding unit, the metal film E3 may be located in an area along the boundary supported by this single holding unit. Instead of the metal film E3, an insulator film or a semiconductor film can be provided to function as a frequency adjustment film.

As illustrated in FIG. 5, the width of the metal film E1 in the X-axis direction is equal to the width W1 of the vibrator 120. Moreover, the metal film E2A has a width W2A in the X-axis direction (hereinafter simply referred to as "a width W2A"). The metal film E2B has a width W2B in the X-axis direction (hereinafter simply referred to as "a width W2B"). A gap G2 is formed between the two metal films E2A and E2B. The metal film E3 has a width W3 in the X-axis direction (hereinafter simply referred to as "a width W3"). The width W2A corresponds to the width of a first upper electrode, the width W2B corresponds to the width of a second upper electrode, and the gap G2 corresponds to a gap between the two upper electrodes.

The width W2A and the width W2B are substantially equal to each other. In addition, the gap G2 is greater than the width W11. In the present embodiment, the width W3 is smaller than the widths W2A and W2B, and greater than the gap G2. For example, the widths W2A and W2B are approximately 60 μm, the gap G2 is approximately 36 μm, and the width W3 is approximately 40 μm.

Figure 6:
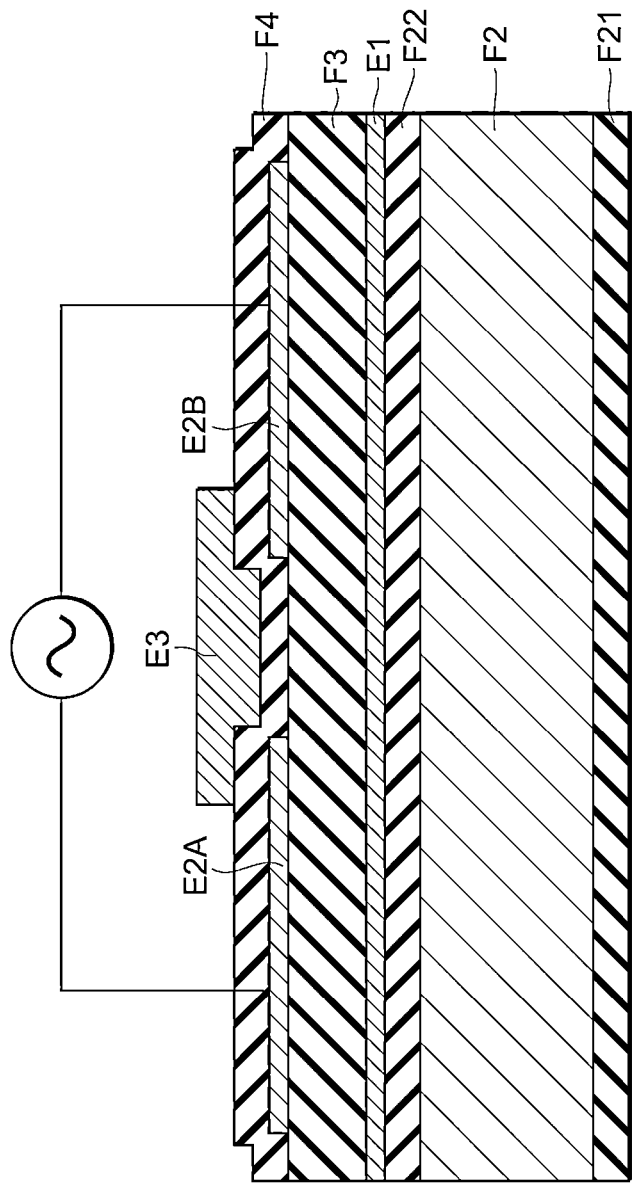
FIG. 6 is a cross-sectional view of the vibrator according to the first exemplary embodiment, illustrating a structure for applying a voltage.
Figure 7:
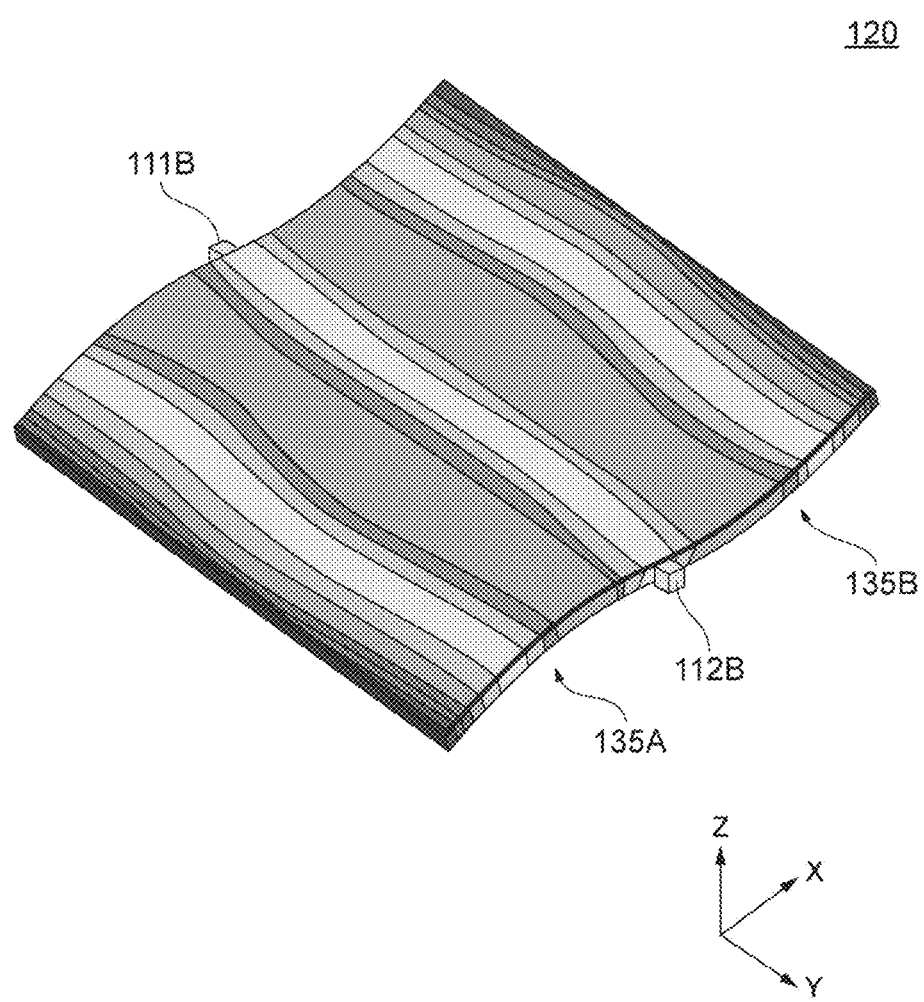
FIG. 7 is a schematic perspective view of a vibration form of the vibrator according to the first exemplary embodiment.

With reference to FIG. 6 and FIG. 7, the operation of the vibrator 120 will be described now. FIG. 6 is a cross-sectional view of the vibrator according to the first embodiment, illustrating a structure for applying a voltage. FIG. 7 is a schematic perspective view of a vibration form of the vibrator according to the first embodiment.

The piezoelectric film F3 expands and contracts in the X-axis direction in the in-plane directions of the XY plane in accordance with the electric field formed between the lower electrode and the upper electrodes. With expansion and contraction of the piezoelectric film F3, the open ends of the two portions 135A and 135B of the vibrator 120 are displaced with respect to the bottom plate 22 of the lower lid 20 and the bottom plate 32 of the upper lid 30, and the vibrator 120 vibrates in the out-of-plane bending vibration mode.

As illustrated in FIG. 6, in the present embodiment, an alternating voltage is applied to the metal films E2A and E2B. The phase of the voltage applied to the metal film E2A and the phase of the voltage applied to the metal film E2B are set to be opposite to each other. The metal film E1 is, for example, grounded. Thus, the phase of the alternating electric field formed between the metal film E1 and the metal film E2A in the first portion 135A is opposite to the phase of the alternating electric field formed between the metal film E1 and the metal film E2B in the second portion 135B. Thus, as illustrated in FIG. 7, the first portion 135A and the second portion 135B are displaced in opposite directions of each other. For example, when the center portion of the first portion 135A is displaced in the Z-axis positive direction toward the inner surface of the upper lid 30, the center portion of the second portion 135B is displaced in the Z-axis negative direction toward the inner surface of the lower lid 20. In FIG. 7, light-colored portions indicate areas displaced by a small amount by vibrations, and dark-colored areas indicate areas displaced by a large amount by vibrations.

The upper electrodes are not disposed at the boundary between the two portions 135A and 135B, and thus the boundary serves as a fixed end for each of the two portions 135A and 135B. In other words, the boundary between the two portions 135A and 135B serves as a node in the vibrator 120. The pair of holding units 110 are connected to the node, and thus can reduce a vibration holding loss or anchor loss. This structure can thus reduce degradation of the Q-value.

Figure 8:
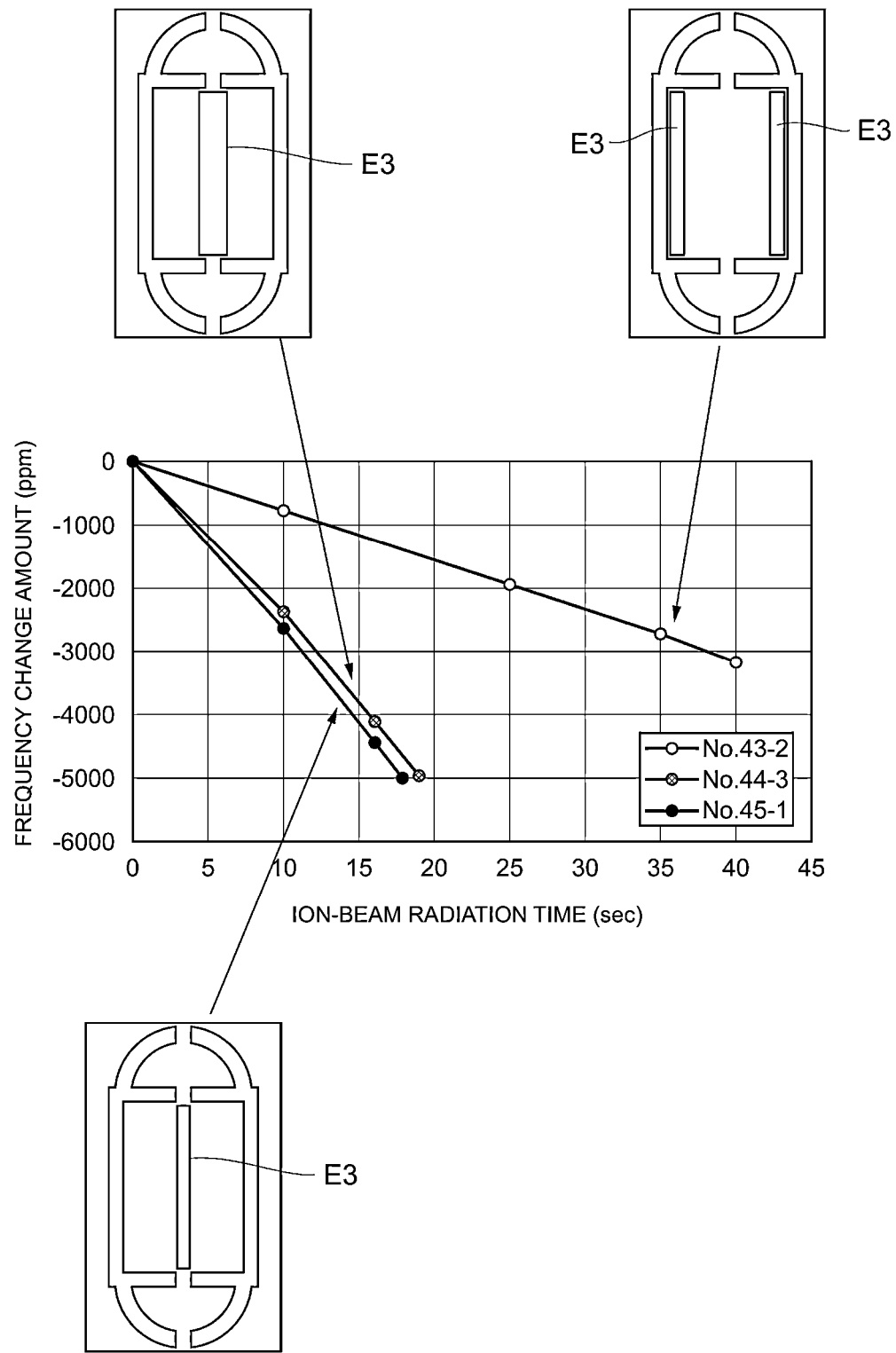
FIG. 8 is a graph illustrating the relationship between the frequency change amount and ion-beam radiation time.
Figure 9:
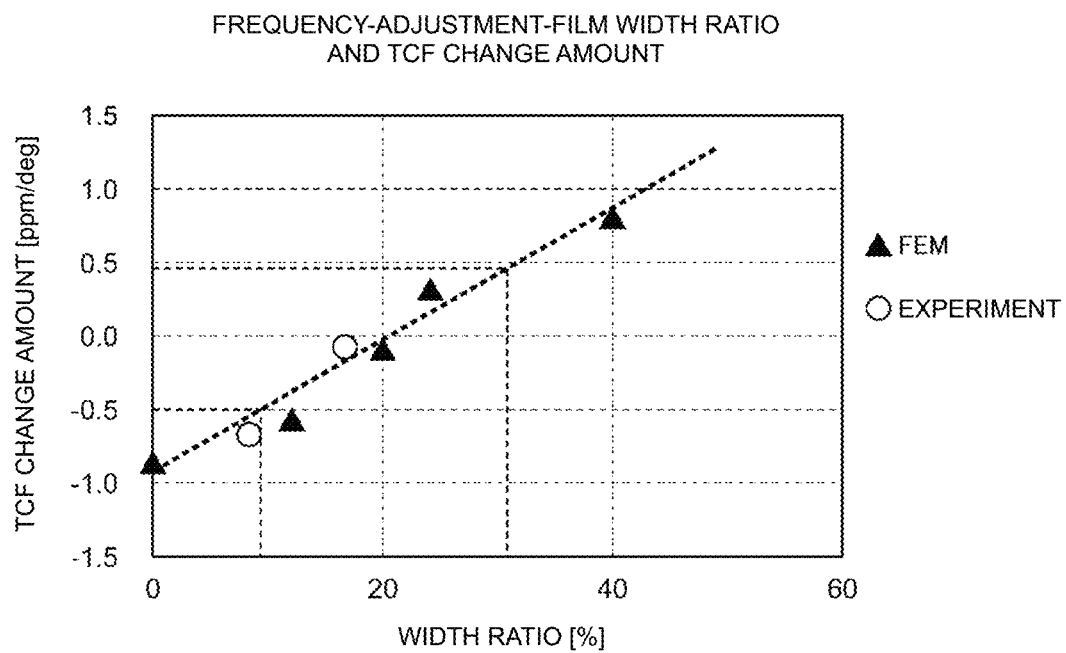
FIG. 9 is a graph illustrating the relationship between a TCF change amount and a frequency-adjustment-film width ratio.

Now, with reference to FIG. 8 and FIG. 9, effects of the exemplary embodiment will be described. FIG. 8 is a graph illustrating the relationship between the frequency change amount and ion-beam radiation time. FIG. 9 is a graph illustrating the relationship between a TCF change amount and a frequency-adjustment-film width ratio.

In particular, FIG. 8 is a graph illustrating the frequency change amount with respect to the time for radiating ion beams to remove a frequency adjustment film in the frequency adjustment process through dry etching. The horizontal axis indicates the ion-beam radiation time in units of seconds, and the vertical axis indicates the frequency change amount in units of ppm. In FIG. 8, two examples and one comparative example are plotted. The two examples have different frequency adjustment films. One of the two examples is a resonator including a frequency adjustment film with a greater width than the gap between the upper electrodes, and the other example is a resonator including a frequency adjustment film with a smaller width than the gap between the upper electrodes. The comparative example is a resonator including frequency adjustment films disposed at end portions of the two portions away from the boundary between the two portions.

Both of the two examples have a larger frequency change amount per unit time than the comparative example. For example, to change the frequency by −3000 ppm, the comparative example requires radiation of ion beams for 35 seconds or more, whereas each of the embodiments only requires radiation of ion beams for 15 seconds or less. This indicates that the present embodiment reduce the time required for the frequency adjustment process and consumption energy.

FIG. 9 illustrates how the TCF change amount changes in the frequency adjustment process when the width of the frequency adjustment film is changed in the present embodiment. The horizontal axis indicates the ratio of the width of the frequency adjustment film to the width of the vibrator 120 (hereinafter referred to as "a width ratio") in units of %. The vertical axis indicates the amount by which the TCF is changed before and after the frequency adjustment process (hereinafter referred to as "a TCF change amount") in units of ppm/deg.

Preferably, the TCF amount has a small change. The TCF change amount is substantially zero when the width ratio is 20%, and increases in proportional to the width ratio. For example, when the width ratio is designed to be higher than or equal to 10% and lower than or equal to 30%, a resonator with the TCF change amount of within +/−0.5 ppm/deg can be manufactured.

As described above, in the first embodiment, the metal film E3 corresponding to the frequency adjustment film is disposed in an area between the connection portions 111B and 112B of the pair of holding units 110 connected to the vibrator 120. When viewed in a plan, the metal film E3 is located in an area closer to the boundary between the two portions 135A and 135B of the vibrator 120 than the center portions of the two portions 135A and 135B. The metal film E3 is located in an area closer to the opposing end portions of the two metal films E2A and E2B than the center portions of the metal films E2A and E2B corresponding to the two upper electrodes. Thus, the frequency adjustment efficiency improves, and the productivity of the resonator 10 improves.

The width of the metal film E3 is greater than or equal to 10% and smaller than or equal to 30% of the width of the vibrator 120. Thus, the TCF change amount before and after the frequency adjustment process falls within +/−0.5 ppm/deg.

The resonator 10 includes the silicon oxide film F22 between the silicon substrate F2 and the metal film E1. Thus, the thermoelastic damping is reduced, and the Q-value is improved.

The resonator 10 includes the silicon oxide film F21 on the side of the silicon substrate F2 opposite to the side on which the metal film E1 is disposed. Thus, the TCF at least around the normal temperature is reduced, and the temperature characteristics are improved.

Hereinbelow, the structure of a resonator 10 or a vibrator 120 according to additional exemplary embodiment will be described. In the following embodiments, components the same as those in the first embodiment will not be described, and only the points different between the embodiments will be described. Particularly, the same effects of the same structures will not be described.

Second Exemplary Embodiment

Figure 10:
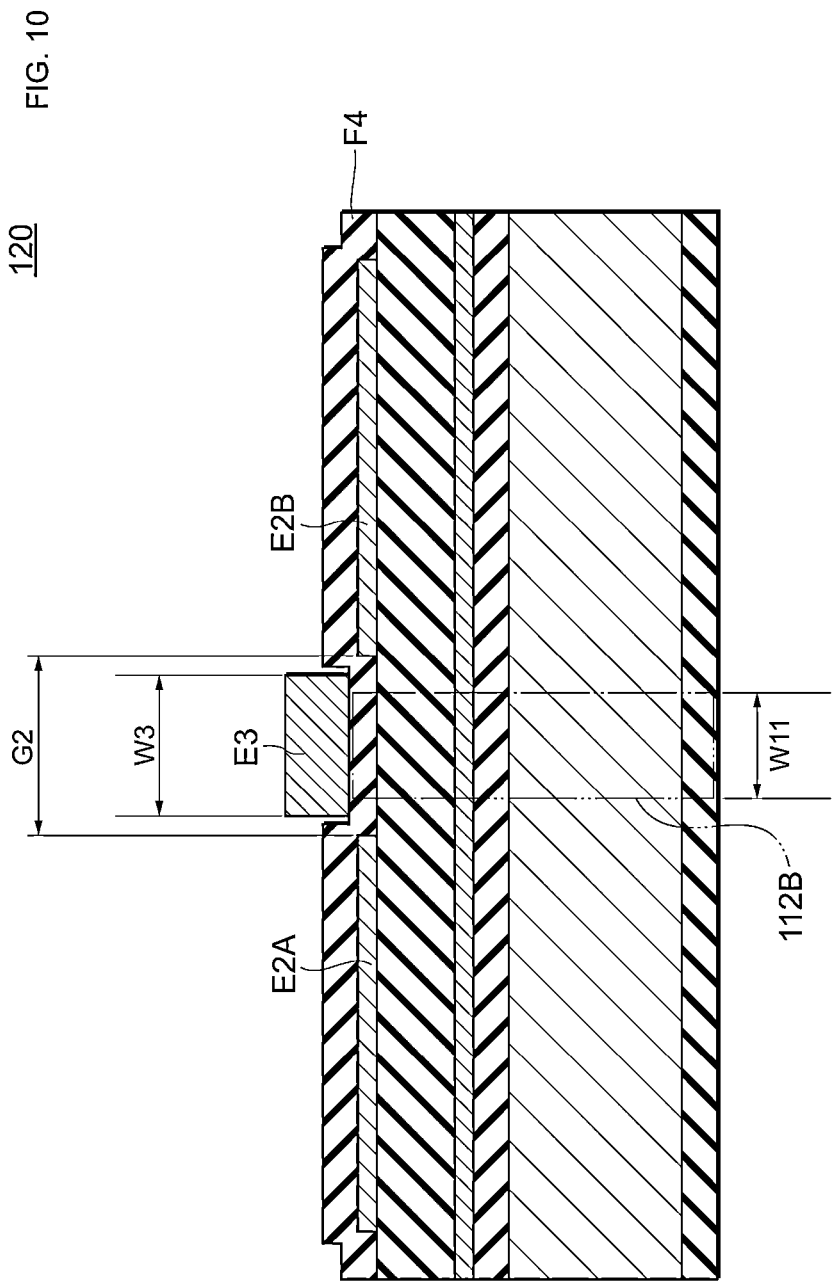
FIG. 10 is a schematic cross-sectional view of the structure of a vibrator according to a second exemplary embodiment.

Subsequently, with reference to FIG. 10, the structure of a vibrator 120 according to a second embodiment will be described. FIG. 10 is a schematic cross-sectional view of a structure of the vibrator according to the second embodiment.

When viewed in a plan, the metal film E3 is spaced apart from the opposing end portions of the two metal films E2A and E2B, and located between the two metal films E2A and E2B. The width W3 of the metal film E3 corresponding to the frequency adjustment film is greater than the width W11 of the connection portions 111B and 112B of the pair of holding units 110 connected to the vibrator 120, and smaller than the gap G2 between the metal films E2A and E2B corresponding to the two upper electrodes.

The protective film F4 may be thinned at a portion covering the opposing end portions of the two metal films E2A and E2B, and thus may be missed at the portion. Even in such a case, the structure according to the present embodiment enables reduction of a short circuit between each of the two metal films E2A and E2B and the metal film E3.

The metal film E3 may be spaced apart from at least one of the opposing end portions of the two metal films E2A and E2B. This structure enables reduction of a short circuit between at least one of the two metal films E2A and E2B and the metal film E3.

Third Exemplary Embodiment

Figure 11:
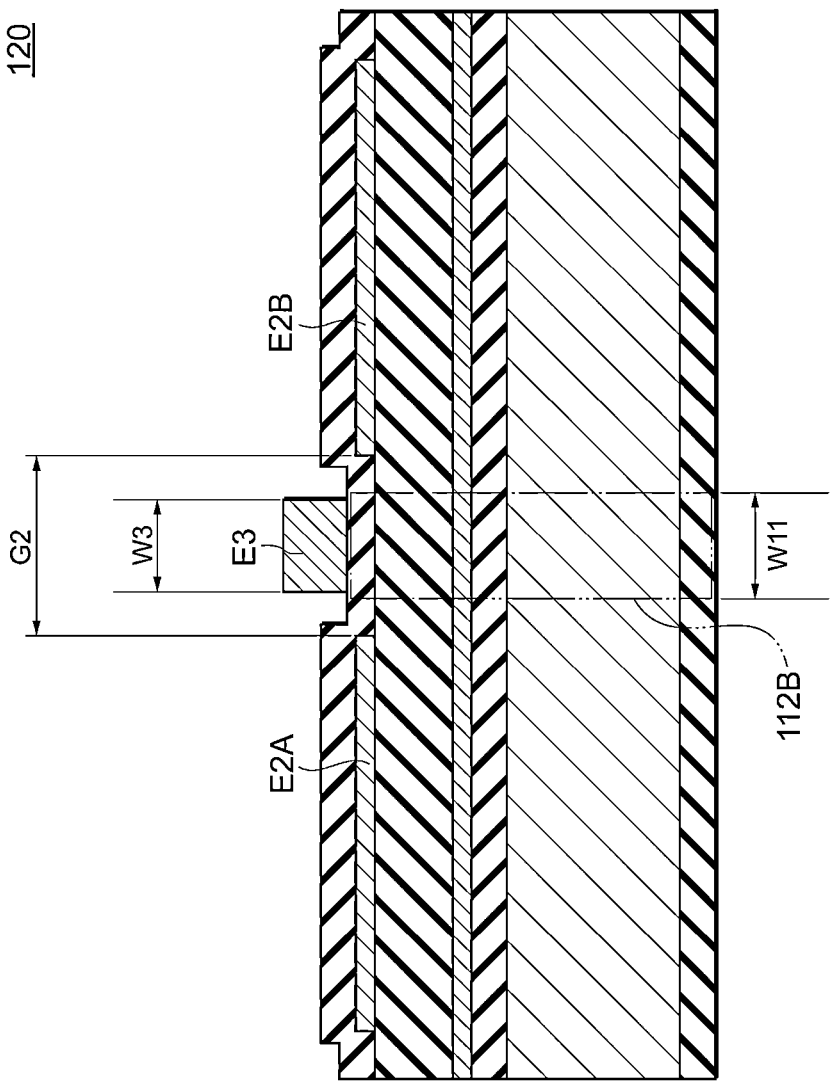
FIG. 11 is a schematic cross-sectional view of the structure of a vibrator according to a third exemplary embodiment.

With reference to FIG. 11, the structure of a vibrator 120 according to a third embodiment will be described. FIG. 11 is a schematic cross-sectional view of a structure of the vibrator according to the third embodiment.

The width W3 of the metal film E3 corresponding to the frequency adjustment film is smaller than the width W11 of the connection portions 111B and 112B of the pair of holding units 110 connected to the vibrator 120. This structure has the same effects as the structure according to the second embodiment.

Fourth Exemplary Embodiment

Figure 12:
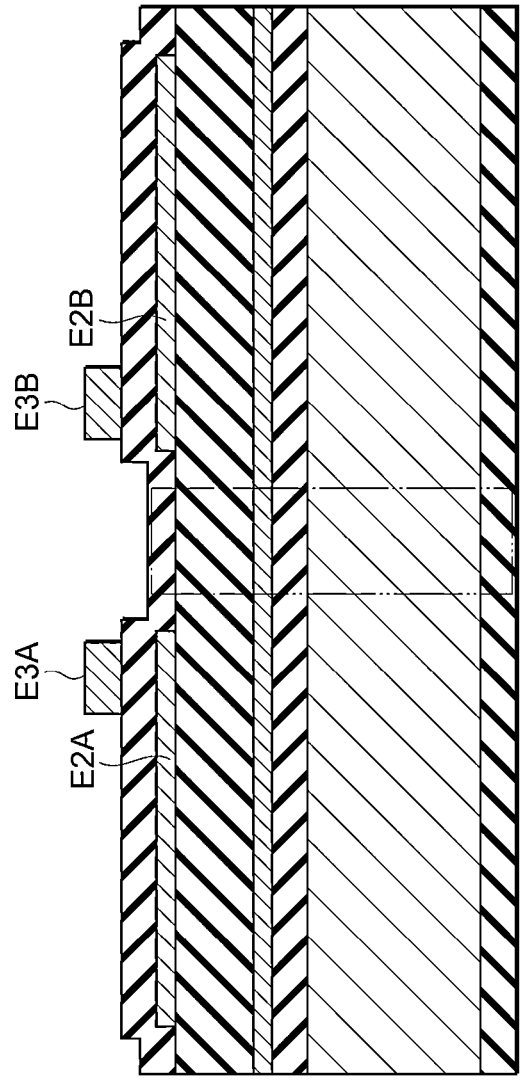
FIG. 12 is a schematic cross-sectional view of the structure of a vibrator according to a fourth exemplary embodiment.

With reference to FIG. 12, the structure of a vibrator 120 according to a fourth embodiment will be described. FIG. 12 is a schematic cross-sectional view of a structure of the vibrator according to the fourth embodiment.

As shown, the frequency adjustment film includes the two metal films E3A and E3B. The metal films E3A and E3B extend in the Y-axis direction, and are arranged side by side at a distance in the X-axis direction. When viewed in a plan, the metal film E3A overlaps the metal film E2A, and the metal film E3B overlaps the metal film E2B. Regardless of when including multiple frequency adjustment films, the vibrator 120 has the same effects as the structure according to the first embodiment.

When viewed in a plan, the metal film E3A is spaced apart from the end of the metal film E2A opposing the metal film E2B, and the metal film E3B is spaced apart from the end of the metal film E2B opposing the metal film E2A. This structure has the same effects as the structure according to the second embodiment.

When viewed in a plan, the two metal films E3A and E3B may overlap the opposing end portions of the two metal films E2A and E2B or may be located between the two metal films E2A and E2B.

Fifth Exemplary Embodiment

Figure 13:
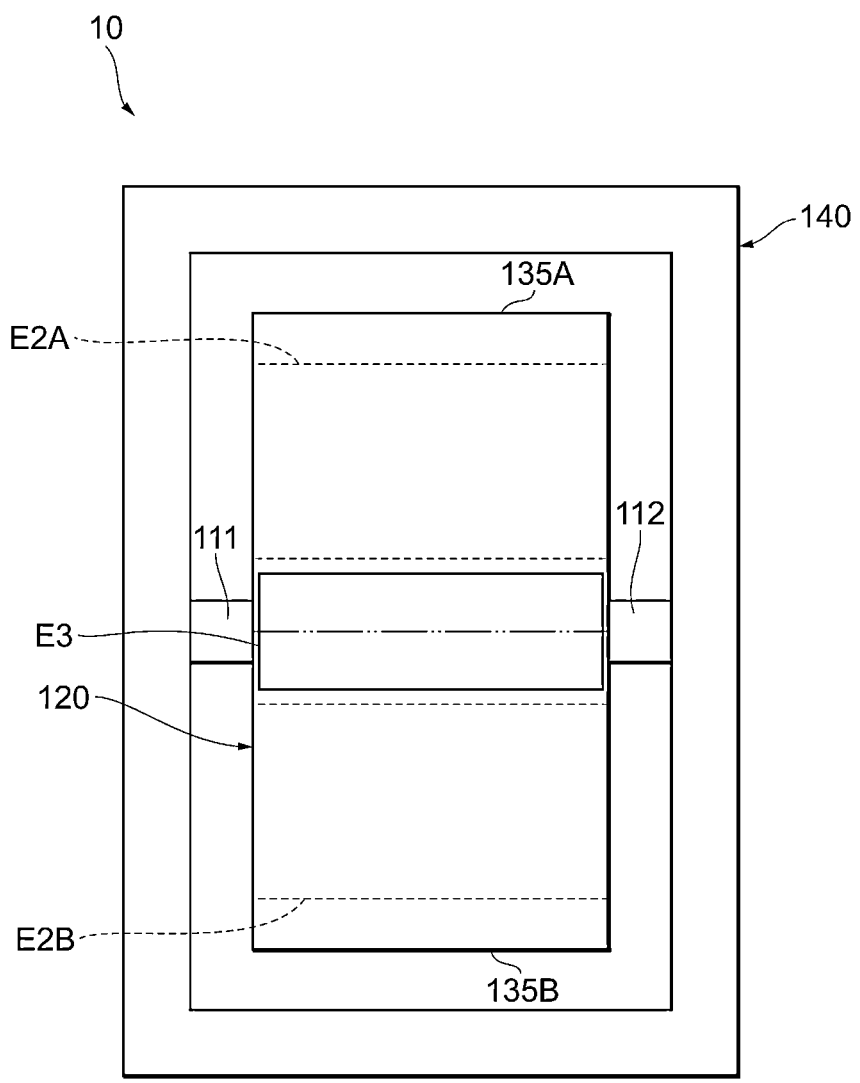
FIG. 13 is a schematic plan view of a structure of a resonator according to a fifth exemplary embodiment.

With reference to FIG. 13 and FIG. 14, the structure of a vibrator 120 according to a fifth embodiment will be described. FIG. 13 is a schematic plan view of a structure of a resonator according to a fifth embodiment. FIG. 14 is a schematic perspective view of a vibration form of the vibrator according to the fifth embodiment.

The vibrator 120 includes the two portions 135A and 135B arranged side by side in the Y-axis direction, and the boundary between the two portions 135A and 135B extends in the X-axis direction. The first portion 135A is located in the Y-axis positive direction from the second portion 135B.

In the exemplary aspect, the holding portion 140 includes prism-shaped frames 140a to 140d. The frames 140a and 140b extend in the X-axis direction, the frame 140a is located in the Y-axis positive direction from the vibrator 120, and the frame 140b is located in the Y-axis negative direction from the vibrator 120. The frames 140c and 140d extend in the Y-axis direction, the frame 140c is located in the X-axis negative direction from the vibrator 120, and the frame 140d is located in the X-axis positive direction of the vibrator 120.

The pair of holding units include prism-shaped holding arms 111 and 112 extending in the X-axis direction. The holding arm 111 corresponds to a connection portion of one of the holding units connected to the vibrator 120, and the holding arm 112 corresponds to a connection portion of the other holding unit connected to the vibrator 120. The holding arm 111 connects the frame 140c of the holding portion 140 to the center portion of the vibrator 120 at an end portion including one of the long sides. The holding arm 112 connects the frame 140d of the holding portion 140 to the center portion of the vibrator 120 at an end portion including the other long side.

As illustrated in FIG. 14, even in the vibrator 120 including the two portions 135A and 135B that vibrate in opposite phases and are arranged side by side along the long sides of the vibrator 120, when the metal film E3 corresponding to the frequency adjustment film is disposed in an area between the connection portions 111 and 112 of the pair of holding units connected to the vibrator 120, the vibrator 120 obtains the same effects as the structure according to the first embodiment.

Modification Example of Fifth Exemplary Embodiment

With reference to FIG. 15 to FIG. 21, the structures of vibrators 120 according to modification examples of the fifth embodiment will be described. Each of FIGS. 15 to 21 is a schematic plan view of the structure of a resonator according to a modification example of the fifth embodiment.

The vibrator 120 illustrated in FIG. 15 differs from the vibrator 120 illustrated in FIG. 13 in that it has a slit SLA extending in the Y-axis direction in the first portion 135A. As shown, the slit SLA extends from the end portion away from the boundary between the two portions 135A and 135B to the boundary between the two portions 135A and 135B. The two portions 135A and 135B have structures asymmetrical with respect to the boundary between the two portions 135A and 135B.

Figure 16:
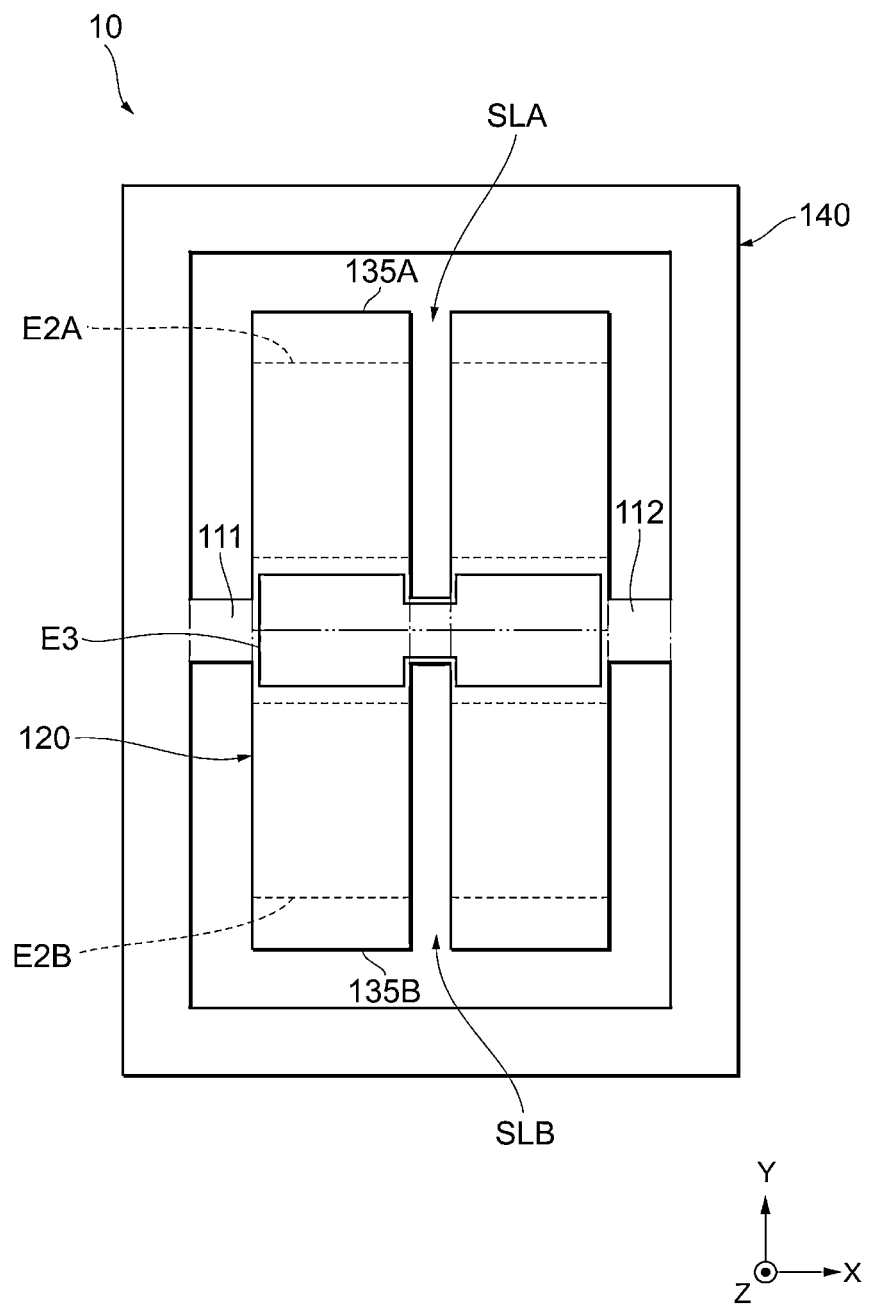
FIG. 16 is a schematic plan view of a structure of a resonator according to a modification example of the fifth exemplary embodiment.
Figure 18:
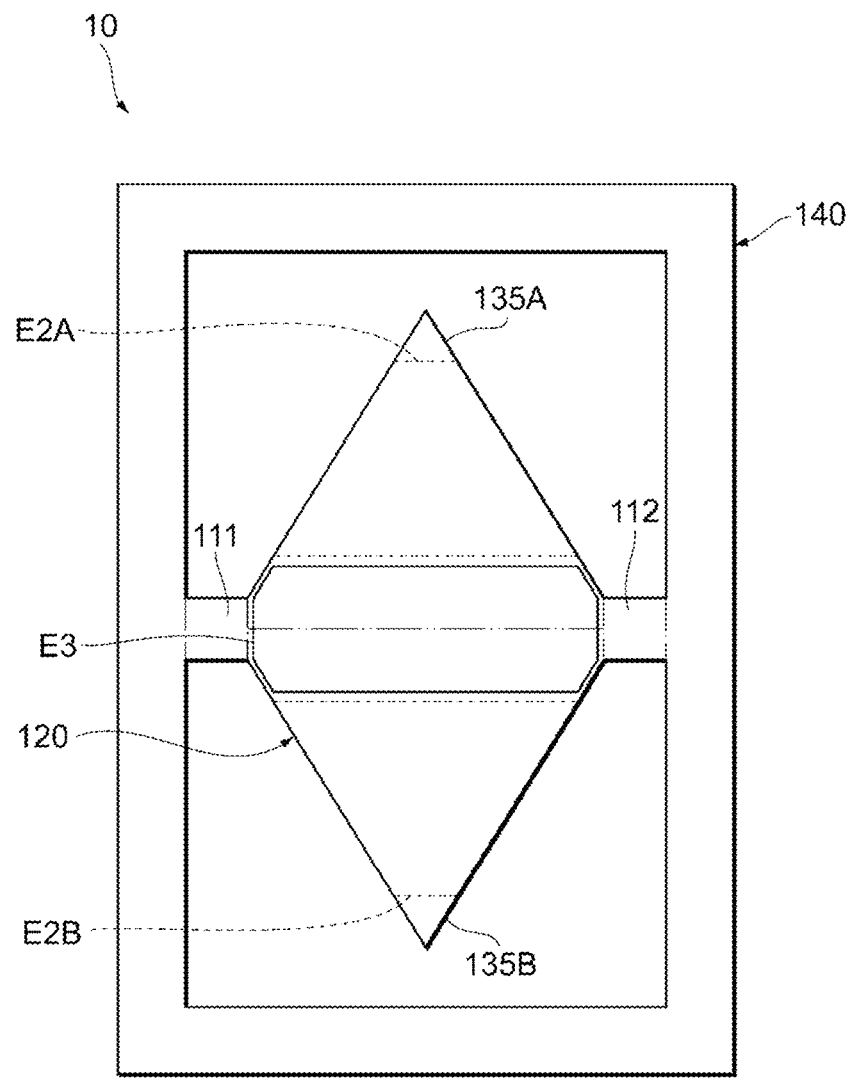
FIG. 18 is a schematic plan view of a structure of a resonator according to a modification example of the fifth exemplary embodiment.

The vibrator 120 illustrated in FIG. 16 differs from the vibrator 120 illustrated in FIG. 13 in that it has a slit SLA extending in the Y-axis direction in the first portion 135A, and a slit SLB extending in the Y-axis direction in the second portion 135B. The slits SLA and SLB extend from end portions away from the boundary between the two portions 135A and 135B and are formed on the same straight line. Moreover, the slits SLA and SLB are spaced apart by the distance substantially the same as the width of the holding arms 111 and 112 according to an exemplary aspect.

The vibrator 120 illustrated in FIG. 17 differs from the vibrator 120 illustrated in FIG. 13 in that the two portions 135A and 135B have a substantially trapezoidal shape. The vibrator 120 illustrated in FIG. 18 differs from the vibrator 120 illustrated in FIG. 13 in that the two portions 135A and 135B have a substantially triangular shape. In modification examples illustrated in FIG. 17 and FIG. 18, the width of the two portions 135A and 135B in the X-axis direction decreases as they are spaced further apart from the boundary between the two portions 135A and 135B. The metal film E3 has a substantially octagonal shape following the shape of the vibrator 120. The metal film E3 may have a substantially hexagonal shape following the shape of the vibrator 120, or may have a rectangular shape.

Figure 19:
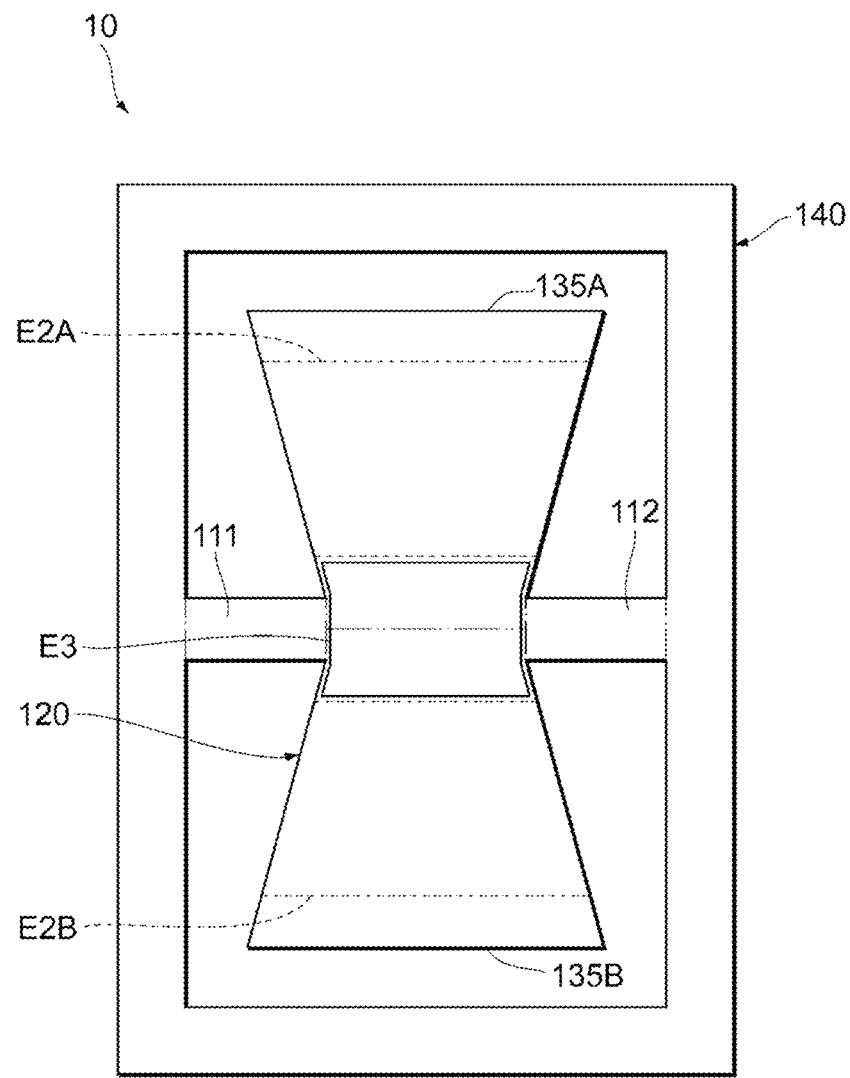
FIG. 19 is a schematic plan view of a structure of a resonator according to a modification example of the fifth exemplary embodiment.

The vibrator 120 illustrated in FIG. 19 differs from the vibrator 120 illustrated in FIG. 17 in that the width of the two portions 135A and 135B in the X-axis direction increases as they are spaced further apart from the boundary between the two portions 135A and 135B. The metal film E3 is recessed at both ends in the X-axis direction.

Figure 20:
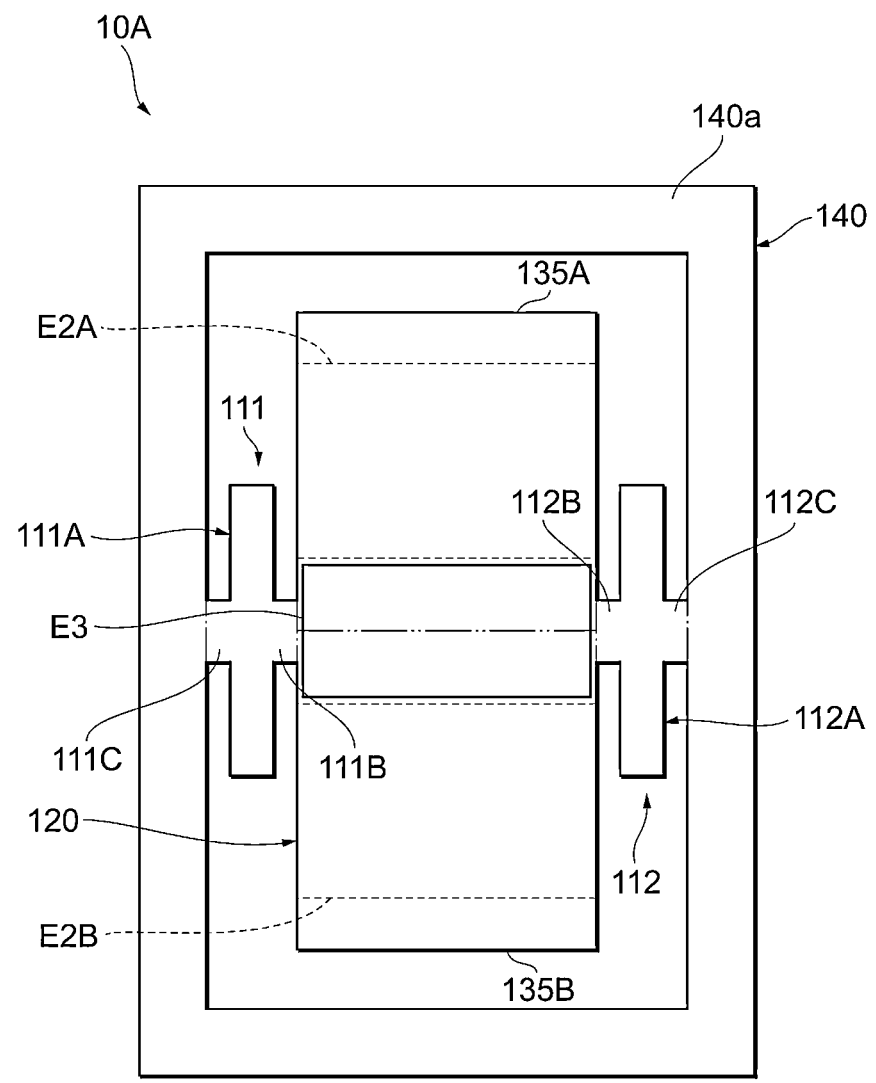
FIG. 20 is a schematic plan view of a structure of a resonator according to a modification example of the fifth exemplary embodiment.
Figure 21:
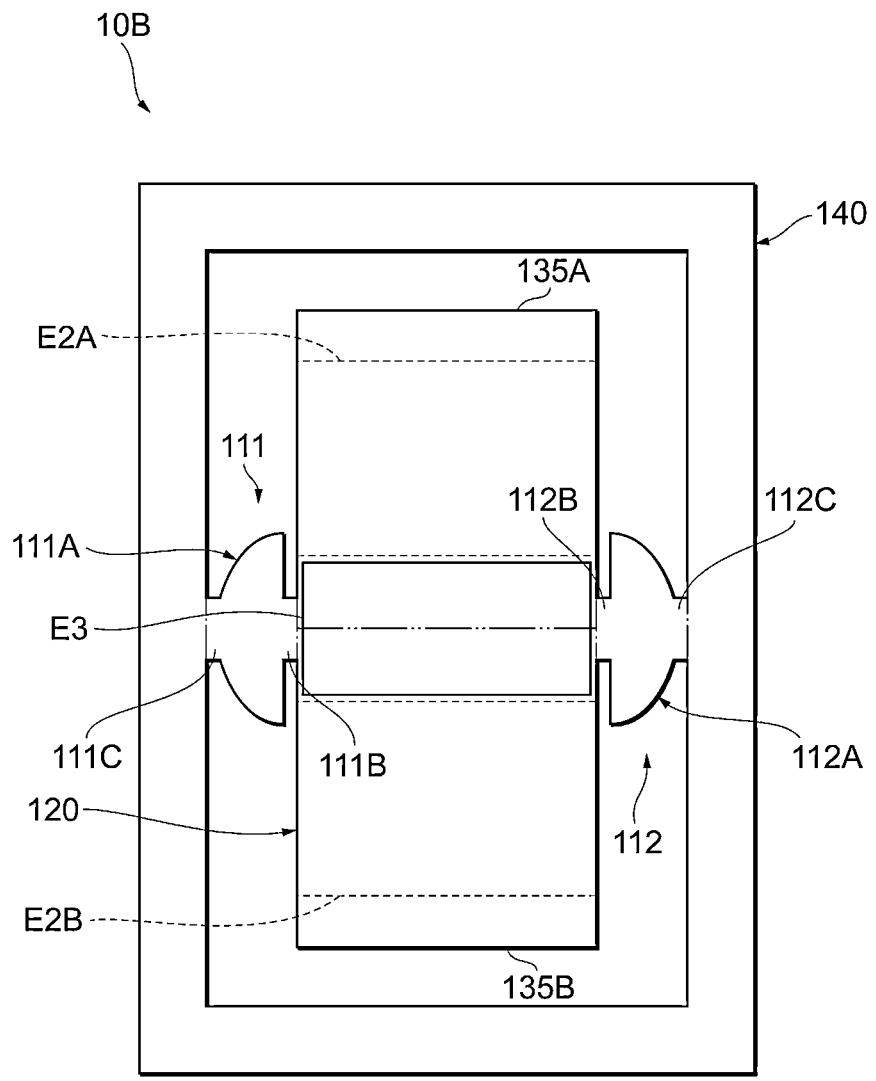
FIG. 21 is a schematic plan view of a structure of a resonator according to a modification example of the fifth exemplary embodiment.

The vibrators 120 in FIG. 20 and FIG. 21 differ from the vibrator 120 illustrated in FIG. 13 in that the holding units 111 and 112 respectively include node generators 111A and 112A. The node generators 111A and 112A illustrated in FIG. 20 are rectangular, and the node generators 111A and 112A illustrated in FIG. 21 are semi-circular. The node generators 111A and 112A are connected to the vibrator 120 with rectangular arms 111B and 112B, and connected to the holding portion 140 with rectangular arms 111C and 112C.

Sixth Exemplary Embodiment

Figure 22:
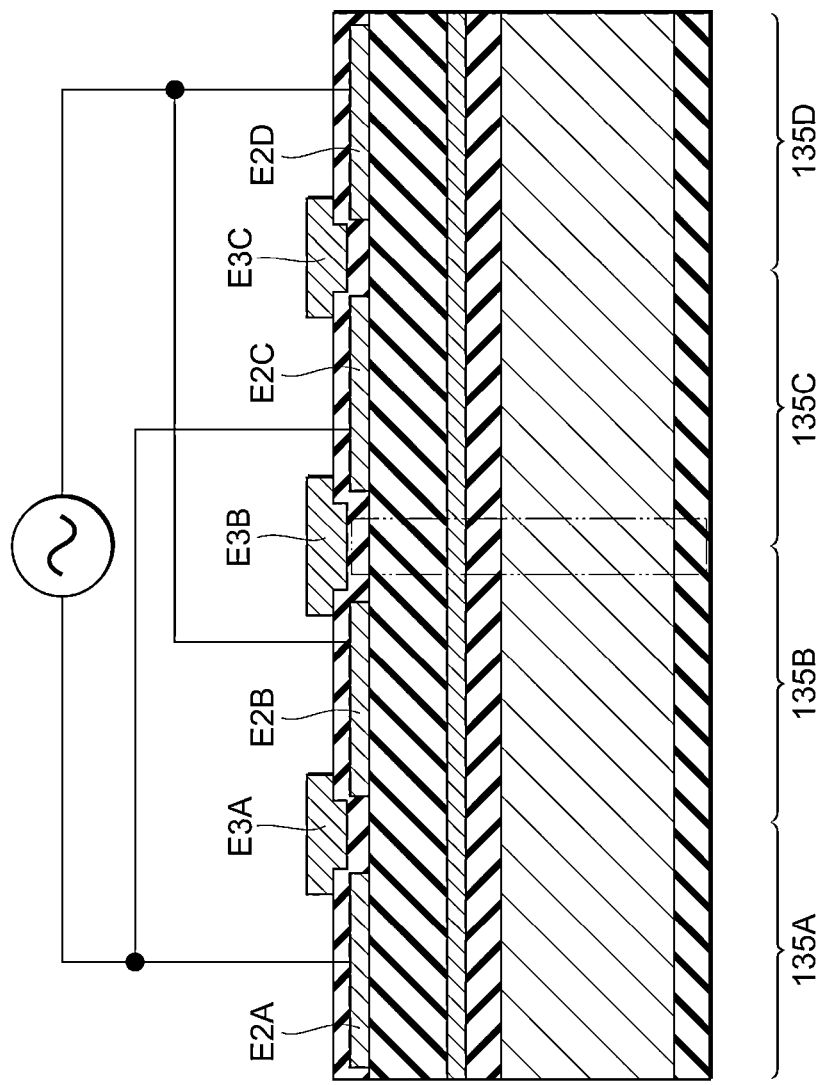
FIG. 22 is a cross-sectional view of a vibrator according to a sixth exemplary embodiment, illustrating a structure for applying a voltage.
Figure 23:
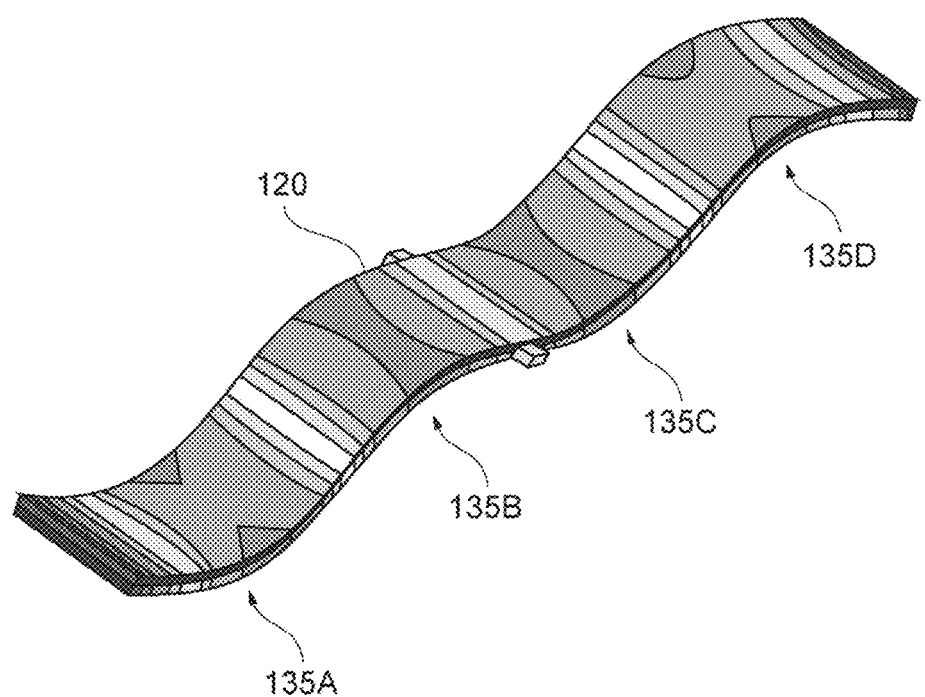
FIG. 23 is a schematic perspective view of a vibration form of the vibrator according to the sixth exemplary embodiment.

Subsequently, with reference to FIG. 22 and FIG. 23, the structure of a vibrator 120 according to a sixth embodiment will be described. FIG. 22 is a cross-sectional view of the vibrator according to the sixth embodiment, illustrating a structure for applying a voltage. FIG. 23 is a schematic perspective view of a vibration form of the vibrator according to the sixth embodiment.

The vibrator 120 includes four portions 135A to 135D where adjacent portions vibrate in opposite phases, and vibrates in a fourth-order out-of-plane bending vibration mode as main vibrations. As shown, the four portions 135A to 135D are arranged side by side in the Y-axis direction. Metal films E2A to E2D corresponding to the upper electrodes are respectively disposed in the portions 135A to 135D. The metal films E2A to E2D are spaced apart from each other.

The metal film E3A is disposed in an area closer to the boundary between the adjacent portions 135A and 135B than the center portions of the adjacent portions 135A and 135B. More specifically, the metal film E3A is disposed at the boundary between the adjacent portions 135A and 135B. Similarly, the metal film E3B is disposed at the boundary between the adjacent portions 135B and 135C, and the metal film E3C is disposed at the boundary between the adjacent portions 135C and 135D.

Even for the vibrator 120 that vibrates in a higher-order even-order mode, when including the frequency adjustment films in areas closer to the boundaries between adjacent portions than the center portions of the adjacent portions, the vibrator 120 has the same effects as the structure according to the first embodiment. The frequency adjustment films are not to be disposed at all the boundaries each between adjacent portions. In the example illustrated in FIG. 22, any one or two of the metal film E3A to E3C may be omitted.

Modification Example of Sixth Exemplary Embodiment

Figure 24:
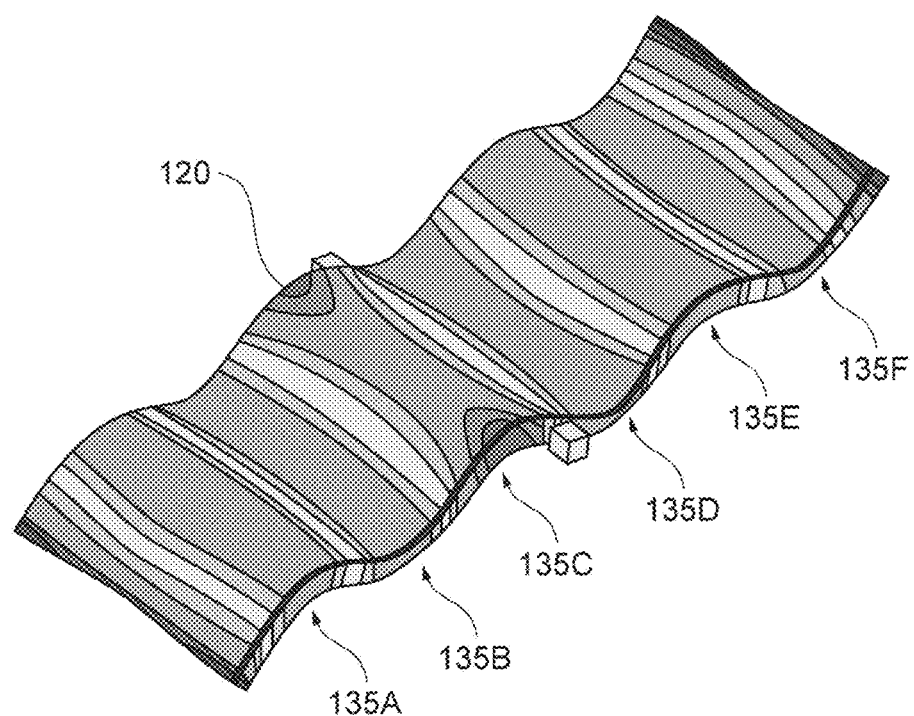
FIG. 24 is a schematic perspective view of a vibration form of a vibrator according to a modification example of the sixth exemplary embodiment.

Subsequently, with reference to FIG. 24, the structure of a vibrator 120 according to a modification example of the sixth embodiment will be described. FIG. 24 is a schematic perspective view of a vibration form of a vibrator according to a modification example of the sixth embodiment.

The vibrator 120 illustrated in FIG. 24 differs from the vibrator 120 illustrated in FIG. 23 in that it includes six portions 135A to 135F where adjacent portions vibrate in opposite phases, and vibrates in a sixth-order out-of-plane bending vibration mode as main vibrations.

Thus, the exemplary embodiments of the present invention are applicable to a vibrator 120 that vibrates in any higher-order vibration mode as main vibrations.

Hereinbelow, part of or all the embodiments of the present invention will be described, and the effects of the embodiments will be described. The present invention is not limited to the following description.

In particular, an exemplary aspect a resonator is provided that includes a vibrator that includes two portions that vibrate in phases opposite to each other, a holding portion (or frame) that is disposed to surround at least part of the vibrator, and a holding unit that supports a boundary between the two portions and connects the vibrator and the holding portion to each other. A frequency adjustment film is disposed on a surface of the vibrator in an area between the vibrator of the holding unit and an end portion of the vibrator facing a connection portion in a direction along the boundary between the two portions.

In one aspect, the holding unit includes a pair of holding units that hold the boundary between the two portions from both sides, and the frequency adjustment film is disposed in an area between connection portions of the holding units connected to the vibrator. Thus, the frequency adjustment efficiency improves, and the productivity of the resonator also improves.

In one aspect, the frequency adjustment film is disposed in an area closer to the boundary between the two portions of the vibrator than center portions of the two portions.

In one aspect, a width of the frequency adjustment film in a direction in which the two portions of the vibrator are arranged side by side is greater than or equal to 10% and smaller than or equal to 30% of a width of the vibrator. Thus, a temperature coefficient of frequency (TCF) change amount before and after the frequency adjustment process falls within +/−0.5 ppm/deg.

In one aspect, a width of the frequency adjustment film in a direction in which the two portions of the vibrator are arranged side by side is smaller than a width of a connection portion of the holding unit connected to the vibrator in the direction in which the two portions of the vibrator are arranged side by side.

In one aspect, the vibrator further includes a piezoelectric film, a lower electrode disposed at a first side of the piezoelectric film, and two upper electrodes that are disposed at a second side of the piezoelectric film and face the lower electrode with the piezoelectric film interposed therebetween in two portions of the vibrator.

In one aspect, a width of the frequency adjustment film in a direction in which the two portions of the vibrator are arranged side by side is smaller than a gap between the two upper electrodes.

In one aspect, when a surface of the vibrator is viewed in a plan, the frequency adjustment film is spaced apart from at least one of opposing end portions of the two upper electrodes. This configuration and structure enables reduction of a short circuit between the end portion of each of the upper electrodes and the frequency adjustment film.

In one aspect, the vibrator further includes a silicon substrate, and a silicon oxide film disposed between the silicon substrate and the lower electrode. This configuration and structure reduces thermoelastic damping and improves the Q-value.

In one aspect, the vibrator further includes a silicon oxide film disposed on a side of the silicon substrate opposite to a side on which the lower electrode is disposed. This configuration and structure reduces a TCF at least around normal temperature, and improves temperature characteristics.

In one aspect, the vibrator includes four or more portions where adjacent portions vibrate in opposite phases, and the frequency adjustment film is disposed in an area closer to a boundary between the adjacent portions than center portions of the adjacent portions.

In one aspect, a resonance device includes any of the above resonators, and a lid that defines an internal space that allows the vibrator of the resonator to bend and vibrate.

In another aspect of the present invention, a resonator includes a vibrator that includes two portions that vibrate in phases opposite to each other, and a frequency adjustment film disposed on a surface of the vibrator in an area closer to a boundary between the two portions of the vibrator than center portions of the two portions. Thus, the frequency adjustment efficiency improves, and the productivity of the resonator improves.

In another exemplary aspect, a resonator is provided that includes a vibrator that includes two portions that vibrate in phases opposite to each other, a holding portion disposed to surround at least part of the vibrator, and a holding unit that connects the vibrator and the holding portion to each other. The vibrator includes a piezoelectric film, a lower electrode disposed on a first side of the piezoelectric film, two upper electrodes that are disposed on a second side of the piezoelectric film and that face the lower electrode with the piezoelectric film interposed therebetween in the two portions of the vibrator, a protective film that covers the two upper electrodes, and a frequency adjustment film that faces the lower electrode with the piezoelectric film and the protective film interposed therebetween. When a surface of the vibrator is viewed in a plan, the frequency adjustment film is disposed in an area closer to opposing end portions of the two upper electrodes than center portions of the two upper electrodes. Thus, the frequency adjustment efficiency improves, and the productivity of the resonator improves.

The exemplary embodiments according to the present invention are applicable as appropriate without limitations to any device that performs electromechanical energy conversion with the piezoelectric effect such as a timing device, a sound generator, an oscillator, or a load sensor.

As described above, according to an exemplary aspect of the present invention, a resonator with enhanced productivity and a resonance device including the resonator can be provided.

In general, it is noted that the embodiments are described above for ease of understanding the present invention, and the present invention should not be construed as being limitative. The present invention can be changed or improved without departing from the gist of the invention, and includes equivalents of those changes or improvements. Specifically, each embodiment changed in design as appropriate by a person having ordinary skill in the art is also included in the scope of the present invention as long as it has any feature of the present invention. For example, components in each embodiment, the arrangement, material, conditions, shapes, and size of the components are not limited to those exemplarily described and can be changed as appropriate. The components in each embodiment can be combined as long as technically feasible, and these combinations are also included in the scope of the present invention as long as they have any feature of the present invention.

REFERENCE SIGNS LIST 1 resonance device
10 resonator
20 lower lid
30 upper lid
110 holding unit
111A, 112A node generator
111B, 112B arm (connection portion connected to vibrator)
111C, 112C arm
120 vibrator
135A, 135B portion
F2 silicon substrate
F21, F22 silicon oxide film
E1 metal film (lower electrode)
F3 piezoelectric film
E2A, E2B metal film (upper electrode)
F4 protective film
E3 metal film (frequency adjustment film)
140 holding portion

The invention claimed is:

1. A resonator comprising:
a vibrator having two portions configured to vibrate in phases opposite to each other;
a frame that surrounds at least part of the vibrator;
a holding unit that supports a boundary between the two portions of the vibrator and that connects the vibrator to the frame; and
a frequency adjustment film disposed on a surface of the vibrator in an area between a connection portion of the holding unit connected to the vibrator and an end of the vibrator that faces the connection portion in a direction along the boundary between the two portions.

2. The resonator according to claim 1, wherein the holding unit includes a pair of holding units that hold the boundary between the two portions from opposing sides.

3. The resonator according to claim 2, wherein the frequency adjustment film is disposed in an area between connection portions of the pair of holding units connected to the vibrator.

4. The resonator according to claim 1, wherein the frequency adjustment film is disposed in an area closer to the boundary between the two portions than center portions of the two portions of the vibrator.

5. The resonator according to claim 1, wherein the frequency adjustment film has a width in a direction in which the two portions of the vibrator are arranged that is greater than or equal to 10% and smaller than or equal to 30% of a width of the vibrator.

6. The resonator according to claim 1, wherein the frequency adjustment film has a width in a direction in which the two portions of the vibrator are arranged that is smaller than a width of the connection portion of the holding unit connected to the vibrator in the direction in which the two portions of the vibrator are arranged.

7. The resonator according to claim 1, wherein the vibrator further includes:
a piezoelectric film,
a lower electrode disposed on a first side of the piezoelectric film, and
two upper electrodes that are disposed on a second side of the piezoelectric film and that face the lower electrode with the piezoelectric film interposed therebetween in the two portions of the vibrator.

8. The resonator according to claim 7, wherein the frequency adjustment film has a width in a direction in which the two portions of the vibrator are arranged that is smaller than a gap between the two upper electrodes.

9. The resonator according to claim 7, wherein the frequency adjustment film is spaced apart from at least one of opposing ends of the two upper electrodes in a plan view of a surface of the vibrator.

10. The resonator according to claim 7, wherein the vibrator further includes:
a silicon substrate, and
a silicon oxide film disposed between the silicon substrate and the lower electrode.

11. The resonator according to claim 10, wherein the vibrator further includes a silicon oxide film disposed on a side of the silicon substrate opposite to a side on which the lower electrode is disposed.

12. The resonator according to claim 1,
wherein the vibrator includes four or more portions where adjacent portions are configured to vibrate in phases opposite to each other, and
wherein the frequency adjustment film is disposed in an area closer to a boundary between the adjacent portions than center portions of the adjacent portions.

13. A resonance device comprising:
the resonator according to claim 1; and
a lid that defines an internal space with the vibrator disposed therein to bend and vibrate during operation.

14. A resonator comprising:
a vibrator having two portions configured to vibrate in phases opposite to each other; and
a frequency adjustment film disposed on a surface of the vibrator in an area closer to a boundary between the two portions of the vibrator than center portions of the two portions.

15. The resonator according to claim 14, wherein the frequency adjustment film has a width in a direction in which the two portions of the vibrator are arranged that is greater than or equal to 10% and smaller than or equal to 30% of a width of the vibrator.

16. The resonator according to claim 14, further comprising:
a frame that surrounds at least part of the vibrator; and
a holding unit that comprises at least one connection portion that connects the vibrator to the frame.

17. The resonator according to claim 16, wherein the frequency adjustment film has a width in a direction in which the two portions of the vibrator are arranged that is smaller than a width of the at least one connection portion in the direction in which the two portions of the vibrator are arranged.

18. A resonator comprising:
a vibrator having two portions configured to vibrate in phases opposite to each other;
a frame that surrounds at least part of the vibrator; and
a holding unit that connects the vibrator to the frame, wherein the vibrator includes:
a piezoelectric film,
a lower electrode disposed on a first side of the piezoelectric film,
two upper electrodes disposed on a second side of the piezoelectric film and that face the lower electrode with the piezoelectric film interposed therebetween,
a protective film that covers the two upper electrodes, and
a frequency adjustment film that faces the lower electrode with the piezoelectric film and the protective film interposed therebetween, and
wherein the frequency adjustment film is disposed in an area closer to opposing ends of the two upper electrodes than center portions of the two upper electrodes in a plan view of a surface of the vibrator.

19. The resonator according to claim 18, wherein the frequency adjustment film has a width in a direction in which the two portions of the vibrator are arranged that is greater than or equal to 10% and smaller than or equal to 30% of a width of the vibrator.

20. The resonator according to claim 18, wherein the frequency adjustment film has a width in a direction in which the two portions of the vibrator are arranged that is smaller than a width of the holding unit in the direction in which the two portions of the vibrator are arranged.

* * * * *